United States Patent
Jain

(10) Patent No.: US 10,620,504 B2
(45) Date of Patent: Apr. 14, 2020

(54) COLOR-CONVERTING STRUCTURES AND LIGHT-EMITTING STRUCTURES AND VISUAL DISPLAYS MADE THEREWITH

(71) Applicant: VERLASE TECHNOLOGIES LLC, Bridgewater, NJ (US)

(72) Inventor: Ajaykumar R. Jain, Reno, NV (US)

(73) Assignee: VerLASE Technologies LLC, Bridgewater, NJ (US)

( * ) Notice: Subject to any disclaimer, the term of this patent is extended or adjusted under 35 U.S.C. 154(b) by 0 days.

(21) Appl. No.: 16/345,160

(22) PCT Filed: Aug. 28, 2017

(86) PCT No.: PCT/US2017/048818
§ 371 (c)(1),
(2) Date: Apr. 25, 2019

(87) PCT Pub. No.: WO2018/084919
PCT Pub. Date: May 11, 2018

(65) Prior Publication Data
US 2019/0284473 A1    Sep. 19, 2019

Related U.S. Application Data

(60) Provisional application No. 62/602,285, filed on Apr. 19, 2017, provisional application No. 62/498,807, (Continued)

(51) Int. Cl.
*G02F 1/355* (2006.01)
*B32B 7/12* (2006.01)
(Continued)

(52) U.S. Cl.
CPC .............. *G02F 1/3556* (2013.01); *B32B 7/12* (2013.01); *C09K 11/0883* (2013.01);
(Continued)

(58) Field of Classification Search
CPC ...... G02F 1/353; G02F 1/3532; G02F 1/3556; B32B 2457/20; B82Y 20/00
See application file for complete search history.

(56) References Cited

U.S. PATENT DOCUMENTS 8,859,412 B2 * 10/2014 Jain ................. H01S 5/3202
257/E21.606
9,437,782 B2 * 9/2016 Bower ................. G09G 3/32
(Continued)

FOREIGN PATENT DOCUMENTS

WO    2016079505 A1    5/2016

OTHER PUBLICATIONS

International Search Report and Written Opinion dated Dec. 19, 2017, in connection with PCT/US2017/048818, filed Aug. 28, 2017.

*Primary Examiner* — Daniel Petkovsek
(74) *Attorney, Agent, or Firm* — Downs Rachlin Martin PLLC

(57) ABSTRACT

Color-conversion structures for converting input pump light of a color to one or more differing colors. In some embodiments, the color-conversion structure includes a color-conversion (CC) layer having an input-side coating configured to optimize the amount of the pump light reaching the CC layer and to optimize the amount of color-converted light output by the CC layer. In some embodiments, the CC layer has an output-side coating configured to minimize the amount of unconverted pump light output from the CC layer and to maximize the color-converted light output from the CC layer. Various treatment for enhancing the performance of color-converting structures are also disclosed, as are a number of material combinations for quantum-well (QW) based CC layers and alternatives to QW-based CC layers. Also disclosed are light-emitting structures that each include a color-conversion structure made in accordance with the
(Continued)

present disclosure, as well as displays composed of such light-emitting structures.

12 Claims, 27 Drawing Sheets

Related U.S. Application Data filed on Jan. 9, 2017, provisional application No. 62/496,969, filed on Nov. 4, 2016.

(51) Int. Cl.
    *C09K 11/08*     (2006.01)
    *C09K 11/62*     (2006.01)
    *C09K 11/64*     (2006.01)
    *C09K 11/70*     (2006.01)
    *C09K 11/74*     (2006.01)
    *C09K 11/88*     (2006.01)
    *H01L 25/075*     (2006.01)
    *B82Y 20/00*     (2011.01)
    *H01L 33/50*     (2010.01)

(52) U.S. Cl.
    CPC ............ *C09K 11/62* (2013.01); *C09K 11/623* (2013.01); *C09K 11/64* (2013.01); *C09K 11/70* (2013.01); *C09K 11/706* (2013.01); *C09K 11/7492* (2013.01); *C09K 11/883* (2013.01); *H01L 25/0753* (2013.01); *B32B 2307/42* (2013.01); *B32B 2457/14* (2013.01); *B32B 2457/20* (2013.01); *B82Y 20/00* (2013.01); *H01L 33/502* (2013.01)

(56) References Cited

U.S. PATENT DOCUMENTS

| | | | |
|---|---|---|---|
| 10,008,645 B2* | 6/2018 | Bonar | .................. H01L 27/156 |
| 2012/0032142 A1 | 2/2012 | Leatherdale et al. | |
| 2012/0037885 A1 | 2/2012 | Schardt et al. | |
| 2012/0223875 A1 | 9/2012 | Lau et al. | |
| 2014/0367633 A1 | 12/2014 | Bibl et al. | |

* cited by examiner

Absorptance (%) and Transmittance (%) vs. Wavelength (nm)

Absorptance (%) and Transmittance (%) vs. Wavelength (nm)

Absorptance (%) and Transmittance (%) vs. Wavelength (nm)

COLOR-CONVERTING STRUCTURES AND LIGHT-EMITTING STRUCTURES AND VISUAL DISPLAYS MADE THEREWITH

RELATED APPLICATION DATA

This application claims the benefit of priority of U.S. Provisional Patent Application Ser. No. 62/496,969, filed on Nov. 4, 2016, and titled "Novel Color Conversion Layer Architectures." This application also claims the benefit of priority of U.S. Provisional Patent Application Ser. No. 62/498,807, filed on Jan. 9, 2017, and titled "Novel Color Conversion Layer Architectures." This application further claims the benefit of priority of U.S. Provisional Patent Application Ser. No. 62/602,285, filed on Apr. 19, 2017, and titled "Novel Color Conversion Layer Architectures." Each of these applications is incorporated by reference herein in its entirety.

FIELD OF THE INVENTION

The present invention generally relates to the field of visual displays. In particular, the present invention is directed to color-converting structures and light-emitting structures and visual displays made therewith.

BACKGROUND

Whether in head mounted displays (HMDs) for virtual reality (VR) applications or in HMDs for augmented reality (AR) applications, near-eye displays (NEDs), or microdisplays, are being touted as the "next big thing" that may ultimately displace smartphones. For AR to fulfill its enormous potential, the market will demand highly mobile, untethered, discreet, and stylish eyewear.

Today's incumbent OLED microdisplays have many shortcomings relative to AR requirements in terms of color quality, resolution, brightness, efficiency, and longevity. Inorganic III-V Nitride (GaN/InGaN/AlGaN) based microLEDs having individually addressable RGB pixels, would be hugely preferred for higher brightness (e.g., for daylight viewing), for high efficiency for long battery life and untethered use, and for very compact forms, but unfortunately such microLEDs only emit monochrome (blue/violet) light. To realize full color, e.g., RGB, pixels, there is a need for a "color conversion" layer that can be positioned in intimate contact with or proximate to the microLEDs and that is efficient in down converting the monochrome (blue/violet) light into corresponding green and reds with little to no inter-pixel crosstalk.

SUMMARY OF THE DISCLOSURE

In an implementation, the present disclosure is directed to a color-converting structure for use with a micro-light-emitting-diode (LED) array comprising individually addressable pixel elements each having a size of 30 microns or less and each emitting pump light of a first color composition. The color-converting structure includes a color converting layer having a input side and a output side spaced from the input side, wherein the input side is designed and configured to face a light emitting region of the micro-LED array and extend over a plurality of the individually addressable pixel elements; and the color converting layer comprises: one or more first direct bandgap semiconductor quantum wells, wherein the one or more first direct bandgap semiconductor quantum wells are designed and configured so that, when the color-converting structure is deployed for use with the micro-LED array, the color-converting layer receives the pump light through the input side and the one or more first direct bandgap semiconductor quantum wells convert at least a portion of the pump light from the first color composition to a second color composition different from the first color composition so that the color converting layer outputs color-converted light of the second color composition through the output side.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1:
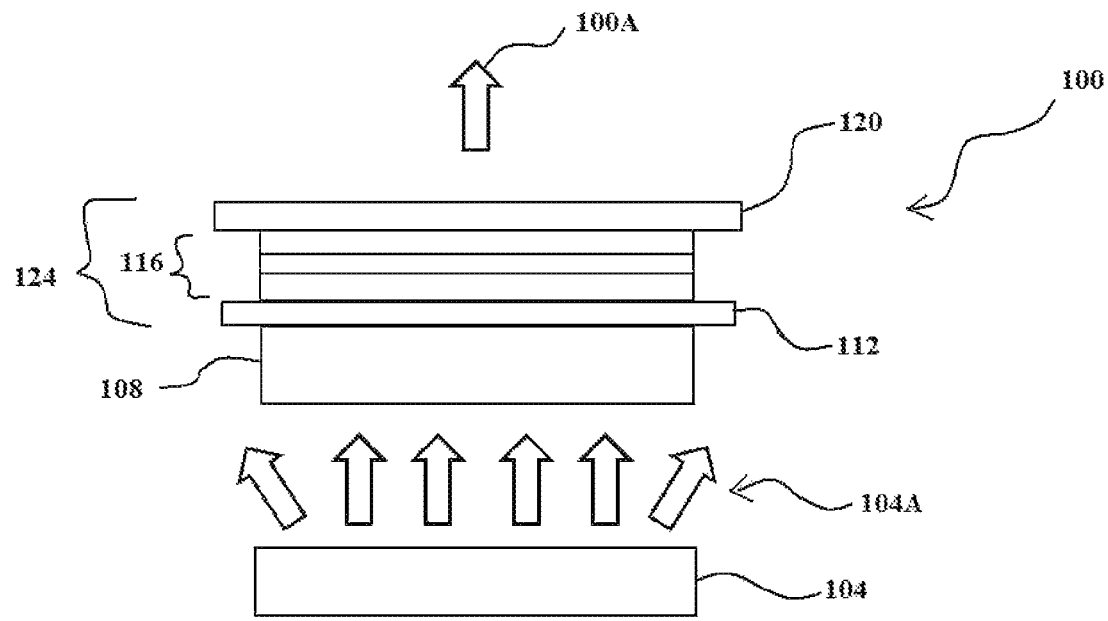
FIG. 1 is a diagram illustrating a light-emitting structure made in accordance with aspects of the present invention.

In some aspects, the present disclosure is directed to color-conversion structures and corresponding light-emitting structures that can be used in visual displays, such as microdisplays for near-eye displays (NEDs) for augmented reality (AR) and virtual reality (VR) applications, among others. As described in detail below, each light-emitting structure of the present disclosure has an architecture that includes a color conversion layer and one or more other functional layers and/or other structures that each provide one or more functionalities that enhance efficiency and/or the viewing quality of the visual display of which the light-emitting structure is part. In other aspects, the present disclosure is directed to displays, for example, microdisplays, incorporating light-emitting structures of the present disclosure. In yet other aspects, the present disclosure is directed to methods of making color-conversion structures and corresponding light-emitting structures.

Before describing detailed examples of the various aspects of the present disclosure, it is noted that the term "layer" as used herein and in the appended claims is determined by the function of the layer and, thus, includes both a monolayer on the one hand and multiple sublayers on the other hand. For example, a reflective layer can be a monolayer (such as the silver layer of a mirror) or can be multiple sublayers (such as the multiple sublayers of a distributed Bragg reflector). As another example, a color-conversion (CC) layer may be composed of a monolayer (such as a single layer comprising phosphor material) or may be composed of multiple sublayers of the same or differing materials (such as multiple sublayers of a quantum well structure). The same logic is used for the term "coating" as used herein and in the appended claims. That is, a "coating" can be a single coating (monolayer) or be composed of multiple sub-coatings (sublayers). It is also noted that the word "treatment" is used herein and in the appended claims. In the present context, a "treatment" includes applying a functional layer or coating to a structure and modifying an interface or other portion of a structure to which a treatment is applied.

Further, aspects of the present invention are particularly pertinent to addressable pixel elements having a pitch on the order of 30 of microns or less along each of the x and y axes in the plane of a display of which they are part. In this connection, the term "pixel element" shall mean any one of the individual light-emitting elements of a pixel (i.e., a grouping of individually colored subpixel elements) that emits a particular color (such as red, green, or blue) that is a component of an overall mixture of colors that forms a portion of an image that a viewer views. "Addressable" means that colored light output of the pixel element is individually controllable (e.g., by controlling the light output of the underlying light source) independently from any other pixel element using any suitable addressing scheme. Addressing schemes and light-control schemes are known in the art for display having larger pitch scales, and those skilled in the art will readily understand how to implement an addressing and light-output control scheme despite the small scale of the light source.

Embodiment 1

Turning now to the drawings, FIG. 1 illustrates an example light-emitting structure 100 made in accordance with the present disclosure. In this example, light-emitting structure includes a pump-light source 104, a substrate 108, an input-side coating 112, a color-conversion (CC) layer 116, and an output-side coating 120. It is noted that the combination of input-side coating 112, CC layer 116, and optional output-side coating 120 and any additional treatment(s) applied thereto, may be considered a color-conversion structure 124. Color-conversion structure 124 can be physically separate and distinct from pump-light source 104 and therefore made independently of the pump-light source. Color-conversion structure 124 can alternatively be monolithically integrated with pump-light source 104 and fabricated in conjunction with the pump-light source, as a design may require.

At a high level, pump-light source 104 provides pump light 104A to CC layer 116, which converts the wavelength(s) of the pump light to create color-converted light, or output light 100A, of one or more other wavelengths for a desire purpose. Examples of uses of light-emitting structure 100 include, but are not limited to, providing a pixel sub-element (e.g., a red, green, or blue sub-element of an RGB pixel), providing two or more sub-elements of a multi-color-pixel, providing two or more sub-elements of each of a plurality of pixels, or providing one or more color elements of a non-pixel light source, among others. In some embodiments, substrate 108 may be configured to provide one or more functions that improve the functioning of light-emitting structure. For example, in a multicolor pixel context, substrate 108 may be configured to inhibit light from pump-light source 104 for one pixel sub-element from reaching an adjacent pixel sub-element to inhibit interference between the sub-elements.

Each of input-side and output-side coatings 112 and 120, when provided, may be tuned to enhance the performance of light-emitting structure 100. For example, input-side coating 112 may be configured and/or selected to be transparent, to one degree or another to pump-light 104A to allow the pump-light to reach CC layer 116, but also be reflective to output light 100A so as to direct the output light toward the output side of light-emitting structure 100. Output-side coating 120, on the other hand, may be configured and/or selected to be transparent to output light 100A to maximize the output of same, but also to be reflective to pump light 104A so as to inhibit negative effects of any unconverted pump light on output light 100A and to increase the likelihood of conversion in CC layer 116. Additional details each of these elements and their functions, as well as examples of each of these elements, are described and provided below.

Pump-Light Source

As noted above, pump-light source 104 provides pump light 104A for CC layer 116. Pump-light source 104 may include, but need not be limited to, one or more light emitting diodes (LEDs) and/or one or more laser diodes (LDs), among other things. Pump-light source 104 may be inorganic or organic, such as an organic LED (OLED). One or more of pump-light sources 104 can be used at the same time. Pump-light source 104 may be monochromatic or polychromatic. If more than one pump-light source 104 is used, one or some of them may be monochromatic and one or more others may be polychromatic. In one example, the input pump source may be comprised of III-V Nitride (GaN/InGaN/AlGaN) compositions.

Pump-light source 104 may be located in any suitable position and may be oriented in any suitable direction, as so desired, in relation to CC layer 116. Pump-light source 104 may face the top, bottom, or side of CC layer 116. In addition, multiple pump-light sources 104 (not shown) from multiple directions may be positioned in relation to CC layer 116. Collimating/Focusing or other optical elements may be positioned in between pump-light source 104 and CC layer 116.

A wide variety of architectures exist for pump-light source 104 and may include, among others, electro-luminescent devices in the form of simple P/N junctions, PIN junctions (homo and heterojunctions), single heterojunction, dual heterojunction, multi-heterojunctions, band-gap engineered quantum confined structures such as: quantum wells, strained quantum wells, superlattices (Type I, Type II), quantum wires, quantum dots, quantum nanotubes (hollow cylinder), quantum nanowires (solid cylinder), quantum nanobelts (solid rectangular cross section), quantum nanoshells, quantum nanofiber, quantum nanorods, quantum nanoribbons, quantum nanosheets, etc.

While certain representative input pump sources have been illustrated, it will be apparent to those skilled in the art that other sources not disclosed herein may be made without departing from the scope of the invention.

Substrate

Substrate 108 may be the growth substrate for pump-light-side layer 112 or may be a transfer surrogate substrate. Substrate 108 may be rigid or flexible and may be composed of one or more polymers, ceramics, metals, papers, fabrics, or glasses or any combination thereof, among other things. Substrate 108 may be transparent, opaque, or translucent. Each material of substrate 108 may be a conductor, an insulator, or a semiconductor. Each material may be inorganic or organic or a combination thereof and may be single crystal, polycrystalline, oriented (or textured) polycrystalline, or amorphous in morphology.

There are fundamentally no limits on the thickness of substrate 108, and in some embodiments the thickness may range from a few microns to several millimeters as desired by application. Additionally, other functionality/functional layers may be built in or on the substrate prior to (or post) device creation. The substrate might intrinsically acts as a planarizing/barrier layer. Scratch resistant layers may be deposited on or under the substrate. UV protection layers may be deposited on the substrate or incorporated within the composition of the substrate. Color filters and black mask coatings may be deposited on the substrate.

Furthermore, chemical resiliency coatings, encapsulation coatings, anti-reflective coatings, anti-fingerprint coatings, anti-static coatings, electrically conductive layers/coatings, anticorrosion layers, flame retardant coatings, adhesive layers, polarizing films, retardation films, or combinations thereof, may be deposited on the substrate, prior or post lamination. These functional layers include, but are not limited to, organic or inorganic layers. While certain representative examples have been mentioned for purposes of illustrating the wide variety of substrates that can be used for substrate 108, it will be apparent to those skilled in the art that substrates not disclosed herein may be made without departing from the scope of the invention.

The surface of substrate 108 can be prepared prior to deposition of any coatings, such as, but not limited to pump-light-side coating 112. The surface may be cleaned with liquid or gas phase chemistries. The surface may be cleaned in-situ or ex-situ using sputtering, plasma cleaning, UV radiation, UHV annealing etc. The purpose of this surface preparation is to create conditions for high(er) bond strength coatings (thru dangling bond creation) onto the surface of substrate 108. While certain representative embodiment of surface preparation techniques are mentioned for purposes of illustration, it will be apparent to those skilled in the art that surface preparation techniques not disclosed herein may be incorporated without departing from the scope of the invention.

Figure 2A:
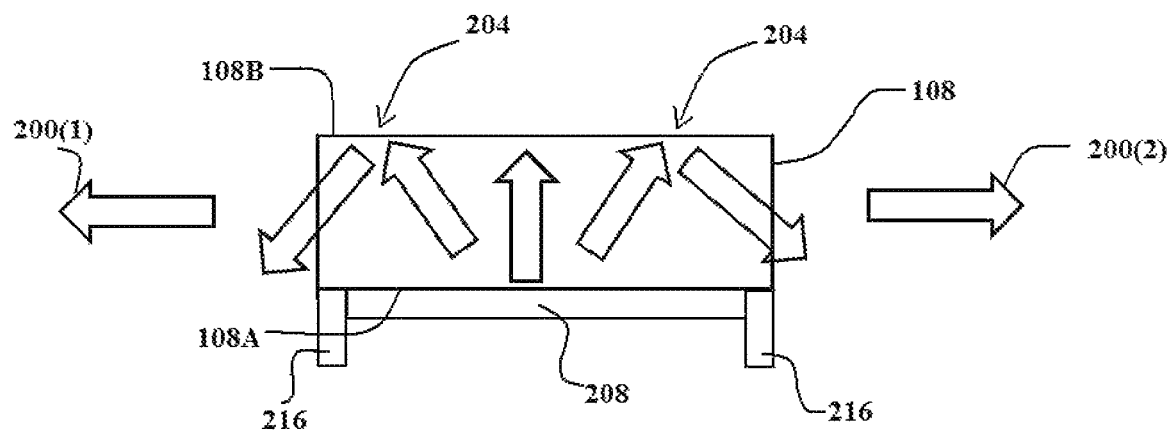
FIGS. 2A to 2C are diagrams of the substrate of light-emitting structure of FIG. 1 illustrating various structures for minimizing unwanted reflections of input pump light and undesirable effects of such reflections.
Figure 2B:
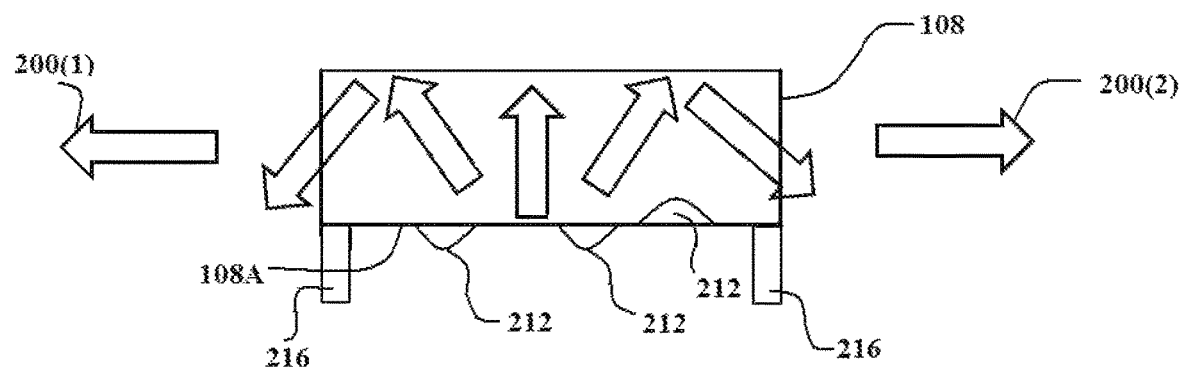
Figure 2C:
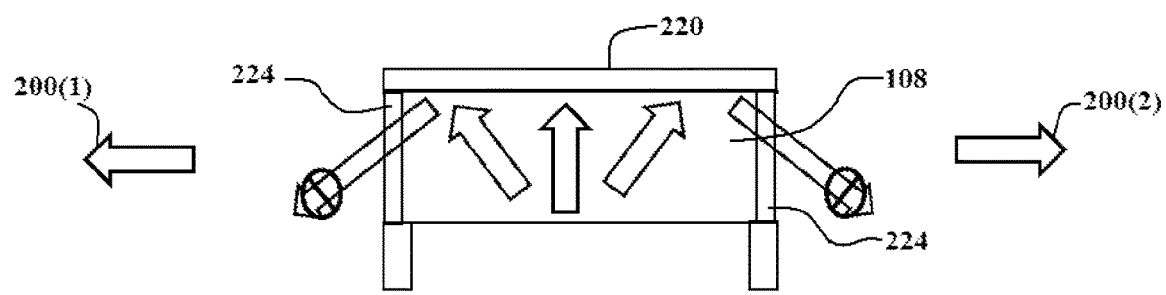

As noted above, substrate 108 can be optimized as desired to enhance the performance of light-emitting structure 100. For example, in a visual display context, it can be desirable to not only minimize the reflection of pump light 104A back toward pump-light source 104, but also to minimize the amount of the pump light that reaches an adjacent pixel. Each of FIGS. 2A to 2C illustrates substrate 108 isolated from other elements of light-emitting structure 100 of FIG. 1. Referring to FIG. 2A, substrate 108 may be considered to have a first interface 108A facing pump-light source 104 (FIG. 1) and a second interface 108B on the opposite side of the substrate, and light-emitting structure 100 (FIG. 1) may be considered to be for a single pixel element that has pixel elements on either side, as indicated by arrows 200(1) and 200(2) representing the presence of adjacent pixel elements, respectively, to the left and right as illustrated. Of course, in three dimensions, additional pixel elements (not shown) may be presented in front of and behind the portion of substrate 108 depicted in FIG. 2A.

As those skilled in the art will appreciate, only some finite cone angle of pump light 104A emitted from pump-light source 104 will in fact enter substrate 108. At high incident angles to interface 108A of substrate 108, a significant portion of input pump light 104A will be reflected back towards pump-light source 104 (FIG. 1) or into adjacent pixel elements via total internal reflection (TIR), illustrated at 204. To minimize these effects, one or more thin film anti-reflection coatings 208 can be deposited on interface 108A, or, alternatively, plasmonic structures (not shown) can be created on interface 108A so as to allow more of input pump light 104A to get inside the substrate. In FIG. 2A, each of the one or more antireflective coatings on the one hand and plasmonic structures on the other are represented by element 208. Referring to FIG. 2B, lensing structures 212, such as optical lenses, prisms, prism films, texturing, or refractive elements, among others, can also be created into or provided onto interface 108A to allow for more of the input pump light to get inside substrate 108.

Additionally and as shown in each of FIGS. 2A to 2C, it can be desirable to create opaque, protruding barriers 216 on interface 108A on the underside of substrate 108 to inhibit input pump light 104A from going into the adjacent pixel elements, here pixel elements 200(1) and 200(2). Barriers 216 may be reflecting or absorbing. Composition of black mask materials (organic, inorganic, semiconducting, and hybrids) are well known in industry and need not be described in detail here for those skilled in the art to understand the variety of ways of implementing barriers 216. Protruding, opaque barriers (not shown) might also or alternatively be created on pump-light source 104.

It is noted that any or all of the solutions noted above relative to FIGS. 2A and 2B may be integrated at interface 108A if so desired. It is also noted that the anti-reflection coating may be different depending on whether input pump light 104A enters the substrate from air, or if substrate 108 (interface 108A) is bonded to pump-light source 104 (FIG. 1). These types of thin film interference coatings are well known in prior art and not detailed further for those skilled in the art to readily understand how to implement them in the present context.

Once interface 108A has been optimized and most of input pump light 104A gets inside substrate 108 and strikes interface 108B, only some finite amount of that light will in fact enter input-side coating 112. At high incident angles to interface 108B, a significant portion of input pump light will suffer from TIR and be reflected multiple times and guided towards and into adjacent pixel elements, here adjacent pixel elements 200(1) and 200(2). To minimize this effect and as illustrated in FIG. 2C, one or more treatments 200, such as one or more thin film anti-reflection coatings applied to interface 108B, or, alternatively, plasmonic structures can be created on interface 108B, so as to allow more of input pump light 104A to get inside input-side coating 112 (FIG. 1). In FIG. 2A, each of the one or more antireflective coatings on the one hand and plasmonic structures on the other are represented by element 208. As with interface 108A above, lensing structures (not shown), such as optical lenses, prisms, prism films, texturing, or refractive elements, can also be created into or onto interface 108B to allow for more of input pump light 104A to get inside input-side coating 112 (FIG. 1).

Additionally, it can be desirable to create opaque barriers 224 inside substrate 108 to prevent input pump light 104A from going into adjacent pixel elements, here pixel elements 200(1) and 200(2). Depending on choice of material(s) for substrate 108 and its thickness, this might or might not be possible if individual pixel elements get very small (on the order of sub 30 microns or less). Barriers 224 may be reflecting or absorbing. Composition of black mask materials (organic, inorganic, semiconducting, and hybrids) are well known in industry and need not be described in detail here for those skilled in the art to understand the variety of ways of implementing barriers 224. Any or all of the solutions noted above maybe integrated at interface 108B, if so desired.

Input-Side and Output-Side Coatings

When provided, input-side and output-side coatings 112 and 120 (FIG. 1) have built in optical functionalities that are elaborated upon further below. The materials for input-side and output-side coatings 112 and 120 may be chosen, for example, from the list of materials described below. Each of input-side and output-side coatings 112 and 120 may be composed of a monolayer or of many sublayers of coating materials composed of metals, dielectrics and/or semiconductor materials. Each of input-side and output-side coatings 112 and 120 may be single crystal, polycrystalline, oriented (or textured) polycrystalline, or amorphous in morphology. Each layer or sublayer of input-side and output-side coatings 112 and 120 may be organic or inorganic in composition.

Each of input-side and output-side coatings 112 and 120 may incorporate one or more metals such as, but not limited to, Al, Au, Ag, Cu, Mo, Cr, Ta, W, Ni, Ti, Si, Ti—Si, Al—Si, Al—Cu, Ti—Al, silicides, etc. Additionally, alloys of metals may also be used. Each of input-side and output-side coatings 112 and 120 may incorporate one or more dielectric materials from the group consisting of oxides, nitrides, carbides, and organics, but not limited to the following. The material may be selected from metal oxides, metal nitrides, metal carbides, metal oxynitrides, metal oxyborides, or combinations thereof. The metallic member may be selected from aluminum, titanium, tantalum, zirconium, niobium, silicon, hafnium, yttrium, nickel, tungsten, alloys thereof, or combinations thereof. The metal oxide or sub-oxide selected may be from silicon oxide, silicon dioxide, aluminum oxide, titanium dioxide, tantalum pentoxide, zirconium oxide, niobium oxide, hafnium oxide, yttrium oxide, nickel oxide, tungsten oxide or combinations thereof. The metal nitride selected may be from aluminum nitride, silicon nitride, boron nitride, germanium nitride, chromium nitride, nickel nitride, titanium nitride, tantalum nitride, gallium nitride, or combinations thereof. The metal carbide selected may be from boron carbide, tungsten carbide, silicon carbide, or combinations thereof. The metal oxynitride selected may be from aluminum oxynitride, silicon oxynitride, boron oxynitride, or combinations thereof. The metal oxyboride selected from zirconium oxyboride, titanium oxyboride, or combinations thereof. Furthermore, low K dielectrics, and organic dielectric materials, polyimides may be substituted as needed. Other typical layers used in the semiconductor industry such as silicon nitride, and silicon dioxide may be utilized. High, medium and low temperature glasses may be used.

Each of input-side and output-side coatings 112 and 120 may include one or more semiconductor materials from the group consisting, but not limited to: Silicon, Ge, SiGe, GaAs, InGaAs, InP, AlGaAs, GaP, InGaP, CdSe, CdS, CdTe, ZnS, ZnSe, ZnO, ZnTe, HgS, HgSe, HgTe, GaN, InGaN, AlGaN, InN, AlN, amorphous silicon, hydrogenated amorphous silicon, polycrystalline silicon, micro-crystalline silicon, nano crystalline silicon, silicon nanowires, monocrystalline silicon, quantum dots, nanodots, SWNT (carbon nanotubes), nanoshells, nanocrystals, quantum islands, quantum wires etc. Since the processes and methods revealed are widely applicable, the semiconductor materials may be organic in nature. Furthermore the semiconductor materials may be doped or undoped. Typical dopant gases such as $PF_5$, $BF_3$, $B_2H_6$, $AsF_5$, etc., may be utilized.

The as-deposited semiconductor layer, if amorphous or small grained, may be further re-crystallized to yield higher carrier mobility and associated performance benefits by using known and emerging re-crystallization processes such as rapid thermal annealing (RTA), rapid thermal processing (RTP), furnace annealing, lamp annealing, argon ion laser annealing, ELA (excimer laser annealing), phase modulated ELA, SA-ELC, metal induced crystallization (MIC), metal induced lateral crystallization (MILC), zone melt recrystallization (ZMR) etc.

Any reflector coating layer or sublayers may be deposited by any known conventional deposition means such as PVD, filament evaporation, RF heating, Electron beam, ion assisted electron beam, sputtering, Diode sputtering, magnetron sputtering, DC sputtering, Bias sputtering, RF sputtering. CVD/thermal CVD/LPCVD/PECVD/APCVD/HDP-CVD/ECR-PECVD/LTPECVD/MOCVD/PVD/hot-wire CVD, sol gel, evaporation, molecular beam (MBE) evaporation, ion-plating, electro-plating, dip-plating (dipping), hot dipping, and electroless-plating, other coating processes, such as a Langmuir-Blodgett process, spin-coating process, spray-coating process, and roll-on coating process; printing processes; transfer processes; ink-jet processes; and powder-jet processes, etc. may also be utilized.

There are fundamentally no limits on the thickness of each of input-side and output-side coatings 112 and 120. Each may be as thin as a few angstroms to several hundreds of microns thick. The thickness of each layer or sublayer of each input-side and output-side coating 112, 120 may or may not be a quarter wave optical thickness (QWOT) at the design wavelength. The coating layer(s) can be of the first order (lambda 4 condition) or a higher order (odd integer >1, lambda/4) solution. One or more coating materials may be combined together to form graded index layers/coatings, so called "rugate coatings." Furthermore, the coatings may form reflector mirrors which may have low, medium, high reflectivity which may range from ~10% to >99.9999%, as required by design.

While certain representative embodiments have been shown for purposes of illustrating the wide variety of coating materials that may be used for each of input-side and output-side coatings 112 and 120, it will be apparent to those skilled in the art that other coating materials not disclosed herein may be used without departing from the scope of the invention.

Figure 3:
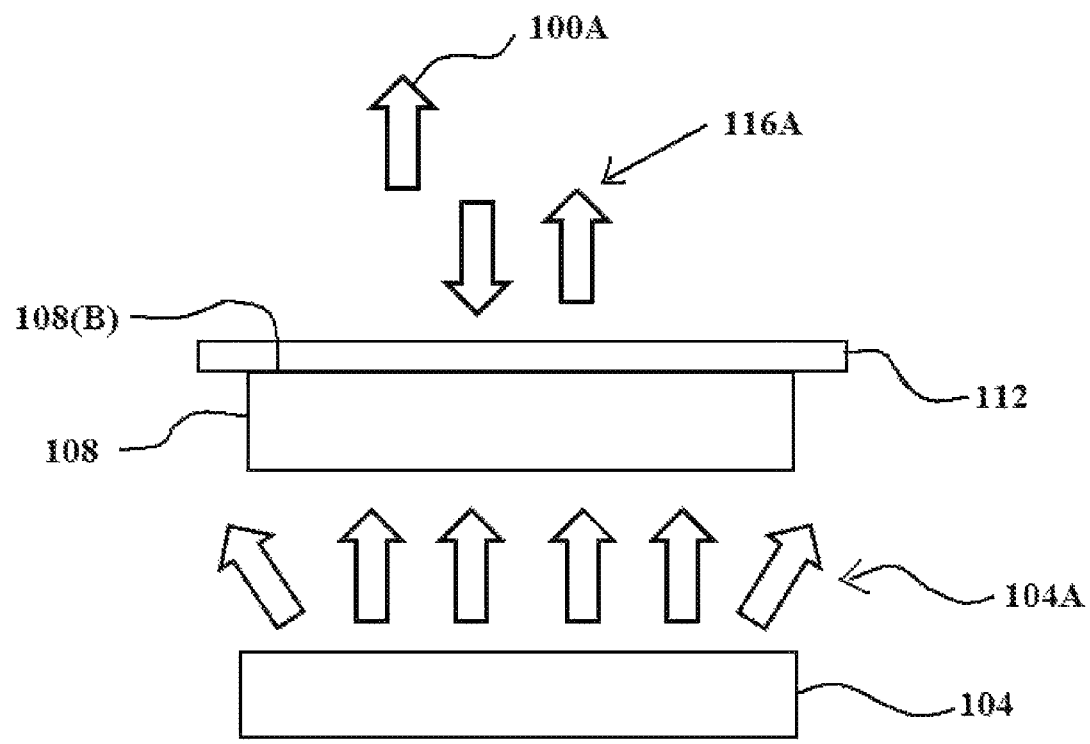
FIG. 3 is a diagram of a portion of the light-emitting structure of FIG. 1 illustrating functionality of the input-side coating.

Referring to FIG. 3, which illustrates pump-light source 104, substrate 108, and input-side coating 112 of light-emitting structure 100 of FIG. 1, an objective of input-side coating 112 is to allow/transmit as much of input pump light 104A as possible to impinge on CC layer 116 (FIG. 1). It is also noted that input-side coating 112 may be index matched to allow for smooth transition from interface 108B of substrate 108 (FIG. 2A) into CC layer 116. For embodiments in which CC layer 116 (FIG. 1) is configured with known, deterministic shapes and forms and therefore has deterministic refractive index and dispersion (e.g., quantum wells, (QWs)), this type of index matching is possible. However, when CC layer 116 (FIG. 1) takes a form of random aggregates (e.g., quantum dots (QDs)), this index matching might not be possible. Additionally, it would be advantageous, but not necessary), to have input-side coating 112 reflect all or most of color-converted light 116A from CC layer 116 (FIG. 1) back towards the CC layer and thru output-side coating 120 (FIG. 1) for output as output light 100A of light-emitting structure 100. It is noted that the anti-reflection coating for interface 108B of substrate 108, if provided, could be built-into input-side coating 112 by design.

Figure 4:
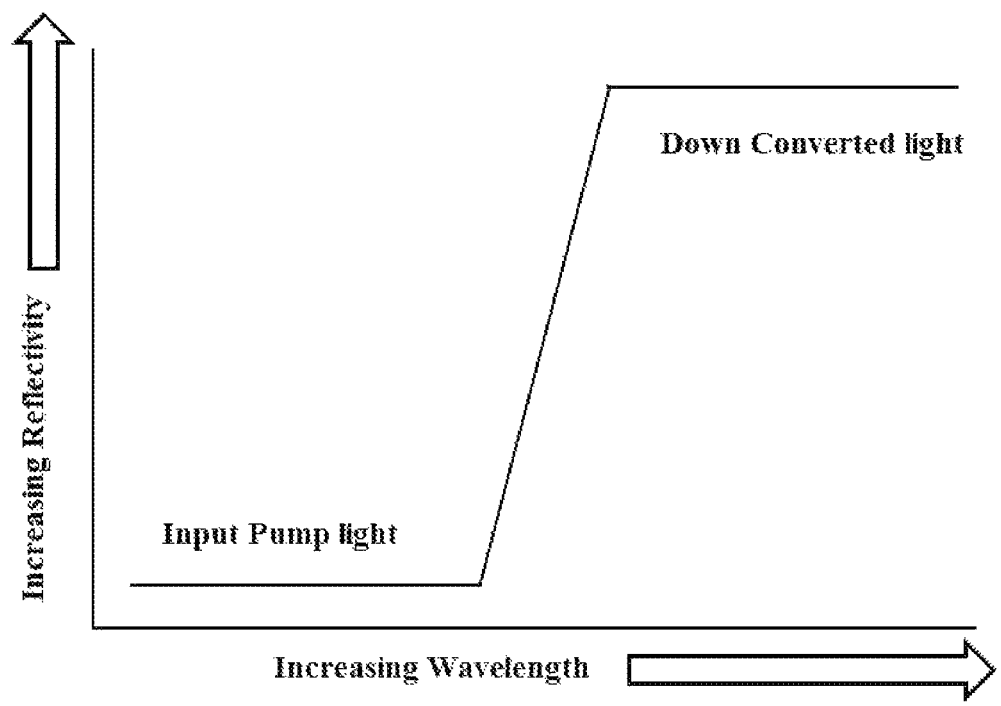
FIG. 4 is a graph of reflectivity versus wavelength for an ideal input-side coating.

Referring now to FIG. 4, and also to FIGS. 1 and 3, in an example with CC layer 116 (FIG. 1) being a down-conversion layer, the spectral response for the reflectivity of input-side coating 112 would look approximately as depicted in FIG. 4, assuming that absorption in the coating is negligible. As seen in FIG. 4, ideally all of pump light 104A would be transmitted by input-side coating 112 so as to reach CC layer 116, and all of color-converted light 116A would be reflected by the input-side coating in attempt to maximize the amount of output light 100A output by light-emitting structure 100 (FIG. 1).

In lieu of optical thin film interference coatings, other types of optical structures and sub-structures for tailoring wavelength specific reflectivity may be employed in input-side coating 112. Such other structures may include, but are not limited to, photonic crystals, 2D photonic crystals, 3D photonic crystals, photonic cavities, sub-wavelength gratings, low contrast gratings, high contrast gratings, nanoporous distributed Bragg reflectors (DBRs), resonant grating filters (comprised of dielectric, metal, or hybrid compositions), etc.

Figure 5:
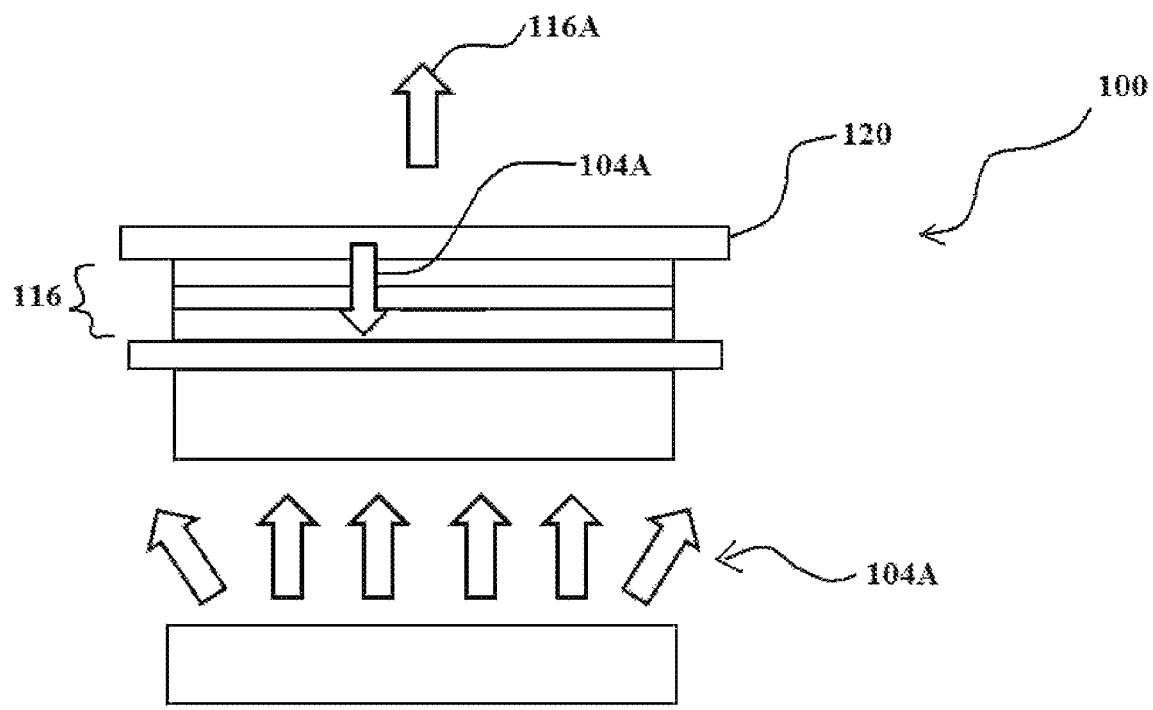
FIG. 5 is a diagram of the light-emitting structure of FIG. 1 illustrating functionality of the output-side coating.

Referring to FIG. 5, which reproduces light-emitting structure 100 of FIG. 1, an objective of output-side coating 120 is to allow/transmit as much of color-converted light 116A from the CC layer 116 as possible. It is noted that output-side coating 120 should to be index matched (e.g., via an anti-reflection coating) to allow for smooth transition from CC layer 116 into the exit medium (not depicted), which may, for example, be air, glass, polymer, or other medium. For embodiments in which CC layer 116 (FIG. 1) is configured with known, deterministic shapes and forms and therefore has deterministic refractive index and dispersion (e.g., quantum wells, (QWs)), this type of index matching is possible. However, when CC layer 116 (FIG. 1) takes a form of random aggregates (e.g., quantum dots (QDs)), this index matching might not be possible.

In addition, it would be advantageous (but not necessary) to have output-side coating 120 reflect all or most of input pump light 104A that does not get absorbed, and therefore not down converted, by the by CC layer 116 back towards the CC layer. This double-pass arrangement serves three functions: 1) for a given thickness of CC layer 116, this double-pass architecture increases the probability of absorption for photons of pump light 104A that do not get absorbed on the first pass; 2) this, in turn, can reduce the thickness of the CC layer required for full (or most) absorption of the pump-light photons; and 3) reflecting all or most of the input pump light by output-side coating 116, reduces/eliminates any of the input pump light from co-mingling with output light 100A and changing its color coordinates and thus corrupting it. For visual applications, it is important to have primary colors as pure as possible. For example if pump light 104A is blue and the color-converted light 116A is green, and if the blue and green were to be allowed to combine to form output light 100A, the resulting additive color comprising blue and green photons would not be ideal for an RGB display panel.

Figure 6:
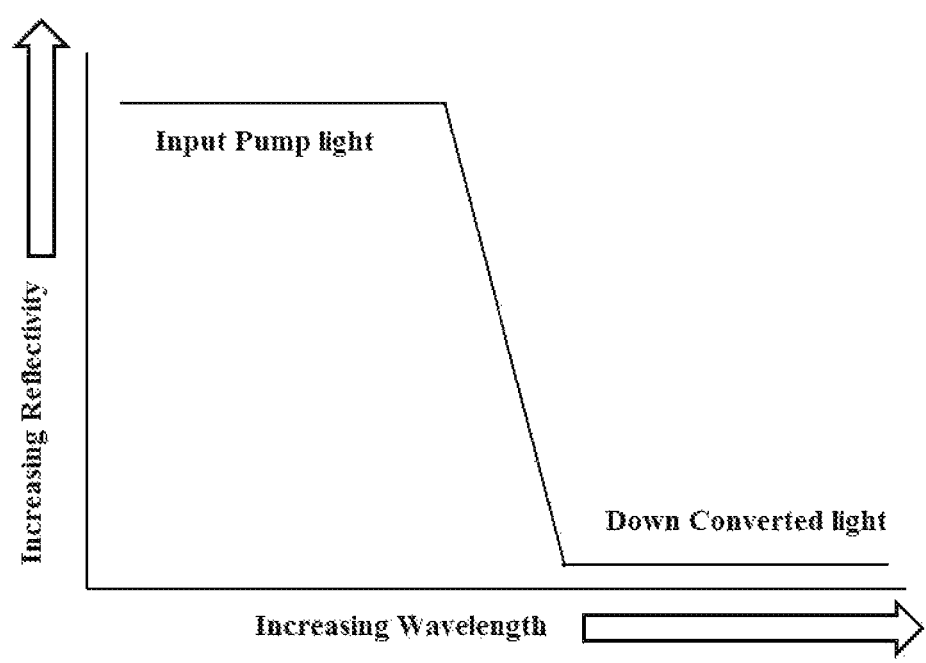
FIG. 6 is a graph of reflectivity versus wavelength for an ideal output-side coating.

Referring now to FIG. 6, and also to FIG. 5, in an example with CC layer 116 (FIG. 5) being a down-conversion layer, the spectral response for the reflectivity of output-side coating 120 would look approximately as depicted in FIG. 6, assuming that absorption in the coating is negligible. As seen in FIG. 6, ideally all of color-converted light 116A would be transmitted by output-side coating 120 so as to become output light 100A, and all of pump light 104A would be reflected by the output-side coating in attempt to minimize the amount of the pump light mixing into the output light and to provide a double-pass of the pump light so as to enhance the likelihood that the input light will participate in the color conversion.

Output-side coating 120 is an optional coating. Depending on actual layout of light-emitting structure 100 and on the material and scheme used for CC layer 116, output-side coating may or may not be required. However, to assure high color purity and to prevent color contamination, it generally would be prudent to include output-side coating 120. It is noted that it might not be possible to evenly deposit output coating 120 atop CC layer 116 when the CC layer is QD-based due to odd shapes of the QDs and temperature handling capability of QDs and the host matrix in which they are embedded.

In lieu of optical thin film interference coatings, other types of optical structures and sub-structures for tailoring wavelength specific reflectivity may be employed in output-side coating 120. Such other structures may include, but are not limited to, photonic crystals, 2D photonic crystals, 3D photonic crystals, photonic cavities, sub-wavelength gratings, low contrast gratings, high contrast gratings, nanoporous DBRs, resonant grating filters (comprised of dielectric, metal, or hybrid compositions), etc.

Color-Conversion Layer

CC layer 116 may be composed of any known semiconductor chemistry. For example, CC layer 116 may, but need not necessarily, be composed of any one or more of the following semiconductor chemistries: amorphous, nano crystalline, single crystalline, micro crystalline, poly crystalline, oriented, and/or textured polycrystalline, phases of any one or more of:

an Si, Ge, Si (1−x), Ge (x) material;
a III-V group material, such as GaN, GaP, GaAs, InP, InAs;
a III-V ternary material, such as GaAsP, InAsP, GaInP, GaInAs, InGaN, AlGaN, AlInN (may have polar, semi-polar, nonpolar, m-plane, c-plane, or any other orientation as desired);
a II-VI binary material, such as ZnS, ZnSe, ZnTe, CdS, CdSe, CdTe, CdSSe, HgS, HgSe, HgTe (may be Zinc Blende or Wurtzite, ZnSe rich or MgS rich alloys);
a IV-VI binary material, such as: PbSe, PbTe, PbS;
an amorphous silicon, hydrogenated amorphous silicon, polycrystalline silicon, micro-crystalline silicon, nano-crystalline silicon, CIGS, CIS, AlGaAs, GaSb, hBN, InSb, HgCdTe, ZnCdS, ZnCdSe, ZnSSe, CuCl, CuBr, CuI, MgS, MgSe, MgTe, BeS, BeSe, BeTe and ternary and quarternary of these compounds;
a zinc blende or Wurtzite phase of:
GaP, AlGaP, AlP, $Al_xGa_{1-x}P$, $GaAs_yP_{1-y}$;
InP, GaInP, InGaP, AlInP, $Al_xIn_{1-x}P$, AlGaInP, $(Al_xGa_{1-x})0.51In_{0.49}P$; and
ZnSe, ZnSSe, CdSSe, $Zn_xCd_{1-x}S_{1-y}Se_y$, $Mg_{1-x}Zn_xS_{1-y}Se_y$;
a beryllium chalcogenide alloy, such as $Be_xZn_yMg_{1-x-y}Se$, $Be_xZn_{1-x}Se_yTe_{1-y}$, $Be_xZn_yCd_{1-x-y}Se$, $Be_{1-x}Cd_xSe$, BeZnSeTe, BeZnCdSe;
a Wurtzite phase of GaP, AlP, GaSe, $Ga_2Se_3$, $Ga_2S_3$, GaInP, or $Al_xGa_{1-x}P$;
a zinc blende phase of $Al_xIn_{1-x}P$;
a transparent semiconducting oxide, such as ZnO, $In_2O_3$, $SnO_2$, $Ga_2O_3$, CdO, $PbO_2$, InGaZnO, ZnSnO (ZTO), ITO, NIO, ZnInO (ZIO), $WO_3$, cadmium indium antimony oxide and other multi component amorphous oxides (MAOs); additionally Perovskite type semiconductors, etc.
an organic semiconductor, monomer, polymers, organic-inorganic hybrid;
a luminescent dye;
other organic semiconductor formulations, such as, but not limited to, thiophenes, pentacene, antracene, tetracene, rubrene, polyArylamine, poly(3-hexylthiophene), poly(p-phenylene vinylene), F8BT, as well as polyacetylene, Polyacene, TPD-N, N'-diphenyl-N, N'-bis(3-methylphenyl)-(1, 1'-biphenyl)-4, 4'-diamine; TAZ-3-(4-Biphenylyl)-4-phenyl-5-tert-butylphenyl-1, 2, 4-triazole; Alq3-tris-(8-hydroxyquinoline) aluminum; CBP-4-4'-N,N'-dicarbazolyl-biphenyl, etc.; and
a hybrid semiconductor (mixture of or nor more organic and inorganic semiconductor formulations).

The as grown/deposited semiconductors, if amorphous or small grained, may be further re-crystallized to yield higher carrier mobility and associated performance benefits using known and emerging re-crystallization processes, such as rapid thermal annealing (RTA), rapid thermal processing (RTP), furnace annealing, lamp annealing, argon ion laser annealing, ELA (excimer laser annealing), phase modulated ELA, SA-ELC, metal induced crystallization (MIC), metal induced lateral crystallization (MILC), zone melt recrystallization (ZMR), SLS, etc. Thus, the resultant semiconducting material may be amorphous, polycrystalline, or monocrystalline in structure.

The semiconductor materials may be deposited by any known conventional deposition process, such as PVD, filament evaporation, RF heating, electron beam, MBE, ion assisted electron beam, sputtering, diode sputtering, magnetron sputtering, DC sputtering, bias sputtering, RF sputtering, CVD/thermal CVD/LPCVD/PECVD/APCVD/HDP-CVD/ECR-PECVD/LACVD(laser assisted CVD)/photolytic LCVD/pyrolytic LCVD/Photo CVD//LTPECVD/MOCVD/PVD/HVPE, LPE, hot-wire CVD, ALD, PLD, sol gel, evaporation, molecular beam (MB) evaporation, epitaxial casting, ion-plating, electro-plating, dip-plating (dipping), and electroless-plating, other coating processes, such as a Langmuir-Blodgett process, spin-coating process, spray-coating process, and roll-on coating process; printing processes; transfer processes; ink-jet processes; and powder-jet processes, etc.

Two or more of the semiconductor materials listed may be combined and deposited together. There are fundamentally no limits on the thickness of these semiconductor coating layers. They may be as thin as a few angstroms to several tens of microns thick.

The semiconductor layer/sublayers may be made/deposited/grown in-situ or made ex-situ and then bonded/affixed on top (or in between) input- and output-side coatings 112 and 120 (FIG. 1).

The semiconductor materials/layer/sublayers used as CC layer 116 may form blanket bulk coatings (macro, micro, nano-films or powders), or they may take the shape of quantum confining structures such as: quantum wells, quantum wires, quantum dots, quantum nanotubes (hollow cylinder), quantum nanowires (solid cylinder), quantum nanobelts (solid rectangular cross section), quantum nanoshells, quantum nanofiber, quantum nanorods, quantum nanoribbons, quantum nanosheets, etc.

In addition, CC layer 116 may take the form of traditional phosphors, which comprise a host matrix doped with rare earth ions (also called dopants/activators) to form luminescent materials. Such luminescent material may be composed of macro, micro, and/or nanopowders of rare earth dopants/activators. Host-matrix materials may include, but not be limited to, crystals, glasses, glass-like compositions, sol gel, semi solid-gel, semiconductors, insulator materials like oxides, nitrides, oxy nitrides, sulfides, selenides, halides, silicates, sialons (silicon aluminum oxy nitride), etc. Alternatively, organic host-matrix materials may be chosen. It is understood that the host-matrix material may be amorphous, nano crystalline, micro crystalline, poly crystalline, textured or single crystal in morphology. The luminescent material may also be composed of metallic nanodots like Au nanodots, Ag nanodots, Al nanodots, etc.

While certain representative embodiments have been provided for purposes of illustrating the wide variety of materials for CC layer 116, it will be apparent to those skilled in the art that materials not disclosed herein may be made without departing from the scope of the invention.

Referring again to FIG. 1, an objective of CC layer 116 is to efficiently absorb pump light 104A and convert that inputted pump light into output light 100A that is spectrally different than the inputted pump light. For down conversion, this implies that the wavelength of the output light is longer than the wavelength of the input light.

Direct bandgap semiconductors have significantly higher absorption coefficients than "traditional" phosphors, on the order of 100 times to 1000 times higher. Additionally, the absorption of direct bandgap semiconductors is broadband. Input pump photons with energy greater than the direct bandgap of the semiconductor can be absorbed, in contrast to traditional phosphors wherein the absorption bands can be quite narrow. Therefore, in some embodiments, direct bandgap semiconductor quantum wells may be used in CC layer 116.

It is noted that both sides of CC layer 116 (via input- and output-side coatings 112 and 120) can be index matched to allow for smooth transition of pump light 104A into the CC layer and output light 100A into the exit medium (not depicted, but such as air, glass, polymer, etc.).

Example Simulated Designs

This section presents simulated designs that illustrate various aspects and considerations for light-emitting structures made in accordance with the present disclosure, such as light-emitting structure 100 of FIG. 1. These simulated designs were made using TFCalc thin film design software available from Software Spectra, Inc., Portland, Oreg. Refractive indexes used for the various materials and coating designs are included in this section. It is noted that the designs presented are for illustration purposes only to elaborate the design logic and are not meant to be limiting in any way. As is known in the art and by domain experts, a variety of thin film interference designs could be conceived and in fact exist to realize the optical functionality revealed herein.

Design 1A

Figure 7:
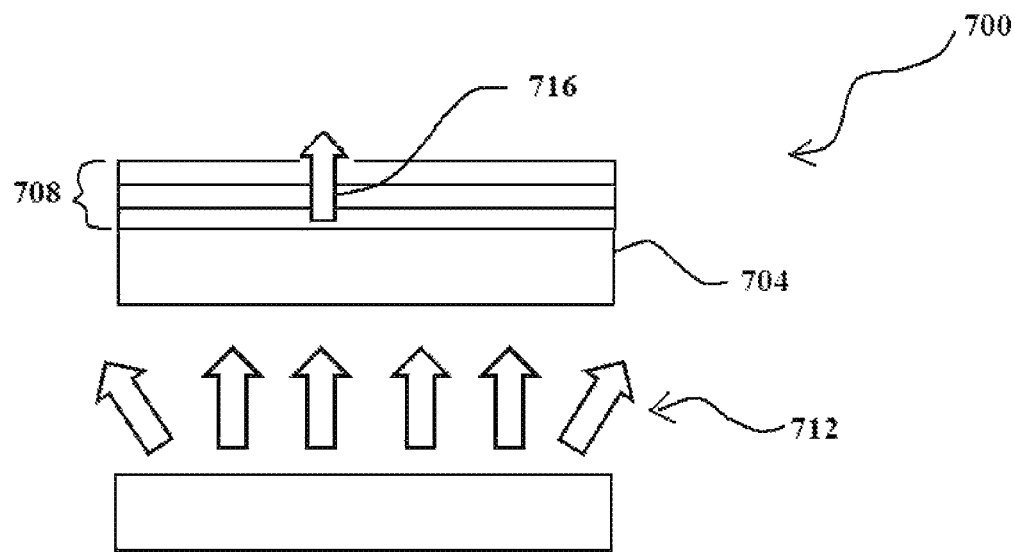
FIG. 7 is a diagram illustrating the optical layout of an example Design 1A of a light-emitting structure.
Figure 8:
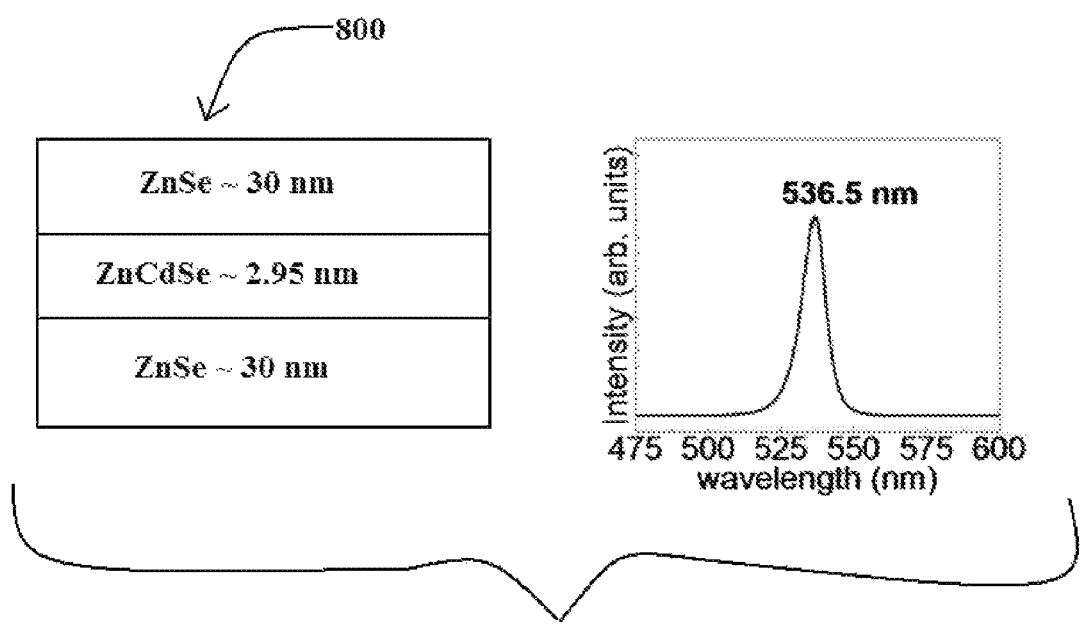
FIG. 8 is a combination of a diagram illustrating the quantum well (QW) stack of Design 1A and a graph of the photoluminescent spectra of that QW stack.

FIG. 7 depicts the optical layout 700 for Design 1A. In this example, optical layout 700 includes a substrate 704 and a CC layer 708 composed of zinc blende quantum well barrier material ZnSe and zinc blende quantum well material $ZnCd_xSe_{1-x}$. In this example, input- and output-side coatings 112 and 120 (FIG. 1) are not provided, and the medium on the output side of CC layer 708 is air. The wavelength of input pump light 712 is about 450 nm, and the wavelength of the outputted down-converted light 716 is about 545 nm. In this design, the following parameters were used for the simulation in the TFCalc software:

Incident media: Glass
(n,k) for glass @ 450 nm: (1.52, 0)
(n,k) for glass @ 545 nm: (1.52, 0)
Substrate: Air
Exit media: Air
(n,k) for Air @ 450 nm & 545 nm: (1, 0)
Barrier material for Quantum Well: Zinc Blende: ZnSe
(n,k) for ZnSe @ 450 nm: (2.78, 0.173)
(n,k) for ZnSe @ 545 nm: (2.612, 0.002)
Well material for Quantum Well: Zinc Blende: $ZnCd_xSe_{1-x}$
(n,k) for $ZnCd_xSe_{1-x}$ @ 450 nm: (2.866, 0.176)
(n,k) for $ZnCd_xSe_{1-x}$ @ 545 nm: (2.681, 0.002)
Input Pump light: ~450 nm
Outputted down converted light: ~545 nm The left-hand side of FIG. 8 shows the basic QW structure 800 used for this simulation. As seen in FIG. 8, single QW structure 800 was composed of a sandwich of ZnCdSe (2.89 nm) sandwiched between two layers of ZnSe (30 nm each). For the simulation, five QW structures 800 were used, such that the total cumulative thickness of the ZnSe was about 300 nm and the total cumulative thickness of the ZnCdSe was about 14.45 nm. This multi-QW stack was assumed to be deposited directly onto (or transferred to) a glass substrate (not shown). Also shown in FIG. 8 is the down-converted photoluminescent spectra (PL) of the II-VI zinc blende quantum well used in the simulation (merely for illustrative purposes).

Figure 9:
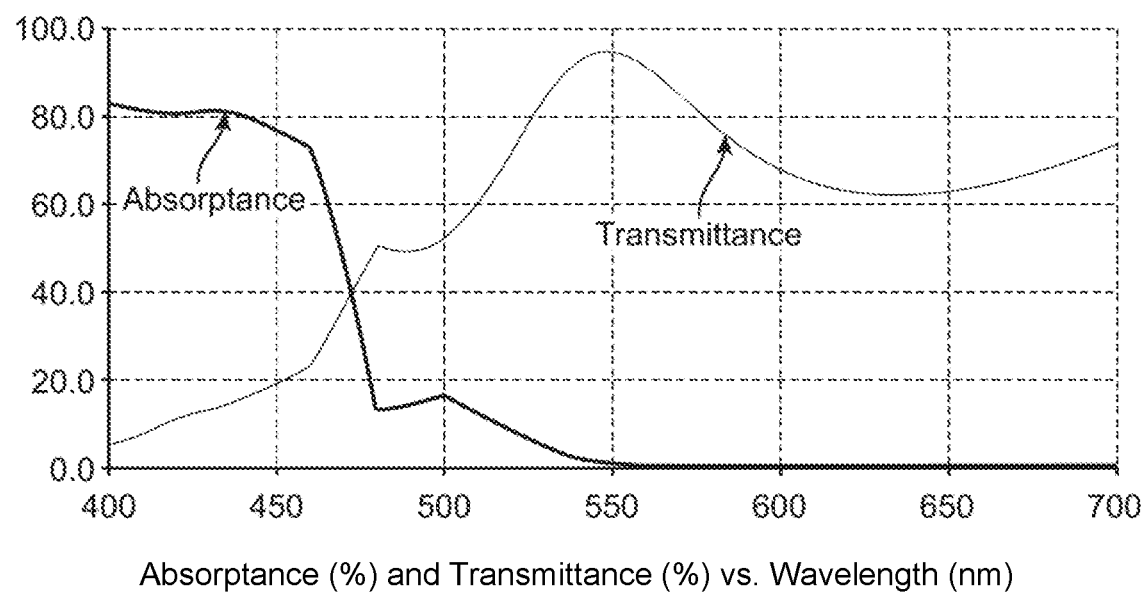
FIG. 9 is an overlay of absorptance and transmittance graphs for a five QW stack on glass of Design 1A.

FIG. 9 depicts an overlay of the absorptance and transmittance graphs for the simulation of the five QW stack on glass. As seen in FIG. 9, approximately 20% of input pump light 712 (FIG. 7) is still transmitted by the QW stack.

Design 1B

Figure 10:
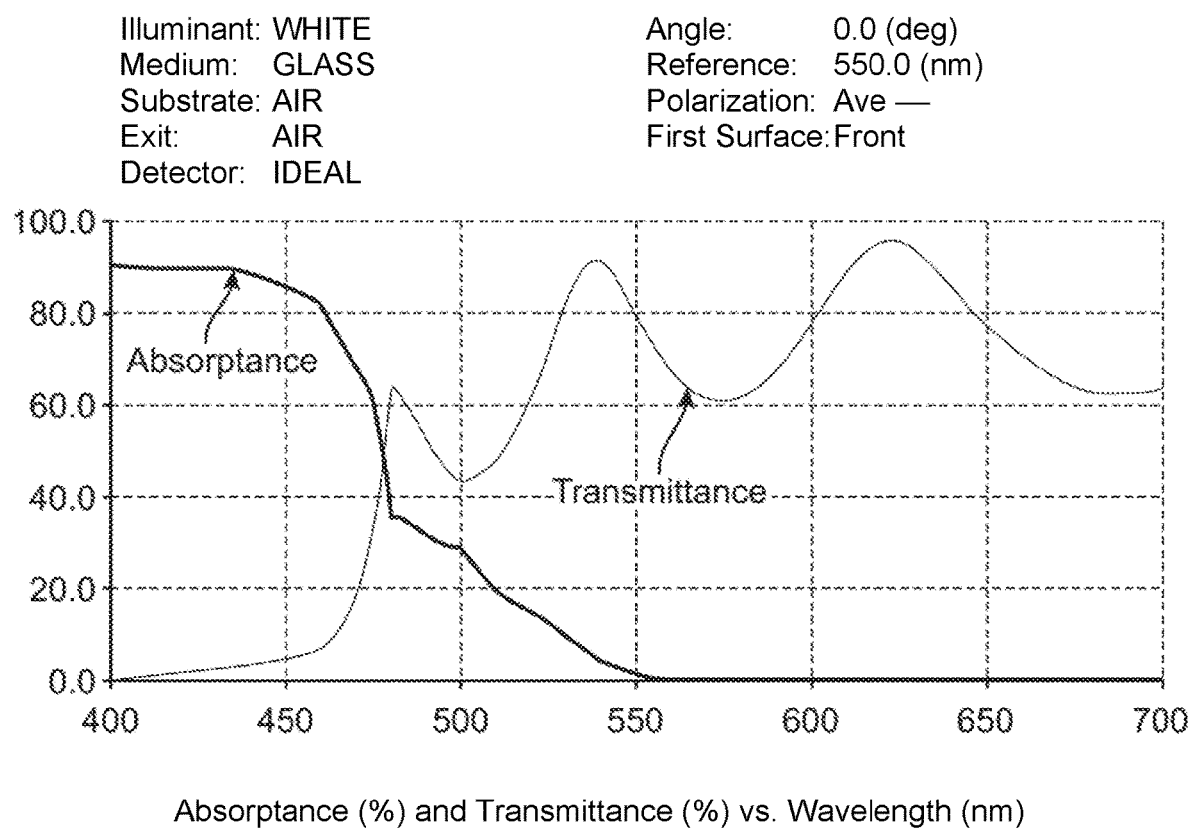
FIG. 10 is an overlay of absorptance and transmittance graphs for a five QW stack and an additional 300 nm of ZnSe for increasing absorption at 450 nm for an example Design 1B.

In Design 1B, another approximately 300 nm of ZnSe was added to increase absorption at 450 nm. FIG. 10 depicts an overlay of the absorptance and transmittance graphs for the simulation of the QW stack with the increased total cumulative thickness of the ZnSe. As seen in FIG. 10, the transmission of input pump light 712 (FIG. 7) was down to about 5.5%. However, note how the absorption band is starting to absorb even at >530 nm. This indicates that in a system like this, the down converted output light 716 (FIG. 7) will suffer from significant "self-absorption."

Design 1C

Figure 11:
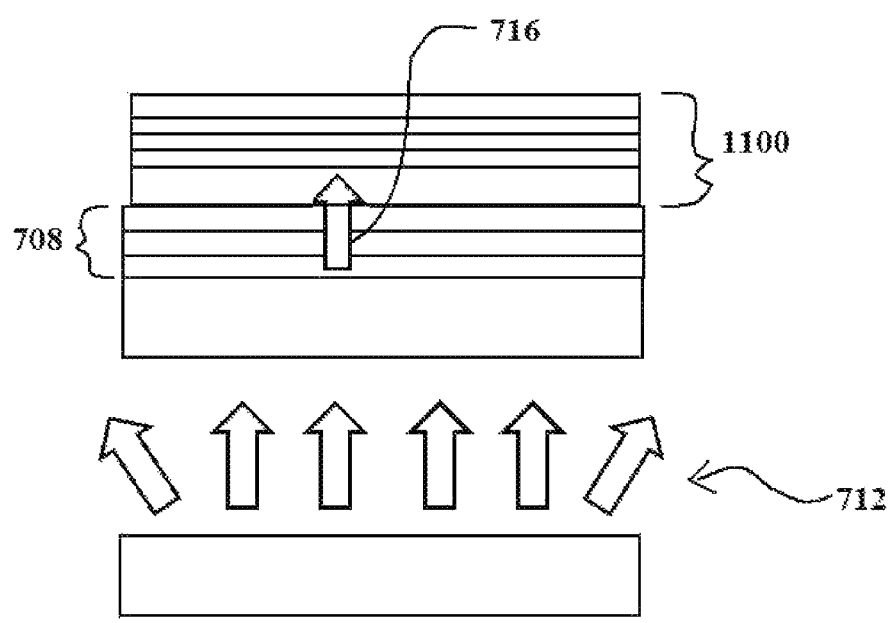
FIG. 11 is a diagram illustrating the optical layout of an example Design 1C of a light-emitting structure that includes a stack of dielectric films functioning as the output-side coating of the light-emitting structure of FIG. 1.

In Design 1C, the approximately 300 nm of ZnSe added in Design 1B was removed, leaving the original 5 QW stack of Design 1A, and, as seen in FIG. 11, a dielectric stack 1100 was added atop CC layer 708. It is noted that dielectric stack 1100 corresponds to output-side coating 120 of FIG. 1 The resulting simulation parameters were as follows:

High Index material: $Nb_2O_5$ (n, k) is (2.3051, 0)
Low Index material: $SiO_2$ (n, k) is (1.478, 0)

Coating design:
   Glass+5 QWs followed by +1.35L 0.35H 0.75L (0.75H 0.75L)^5 0.35H+Air
   H and L refer to quarter waves at a design wavelength of 550 nm.
   "^5" means that the layers in brackets were multiplied 5 times.

Figure 12:
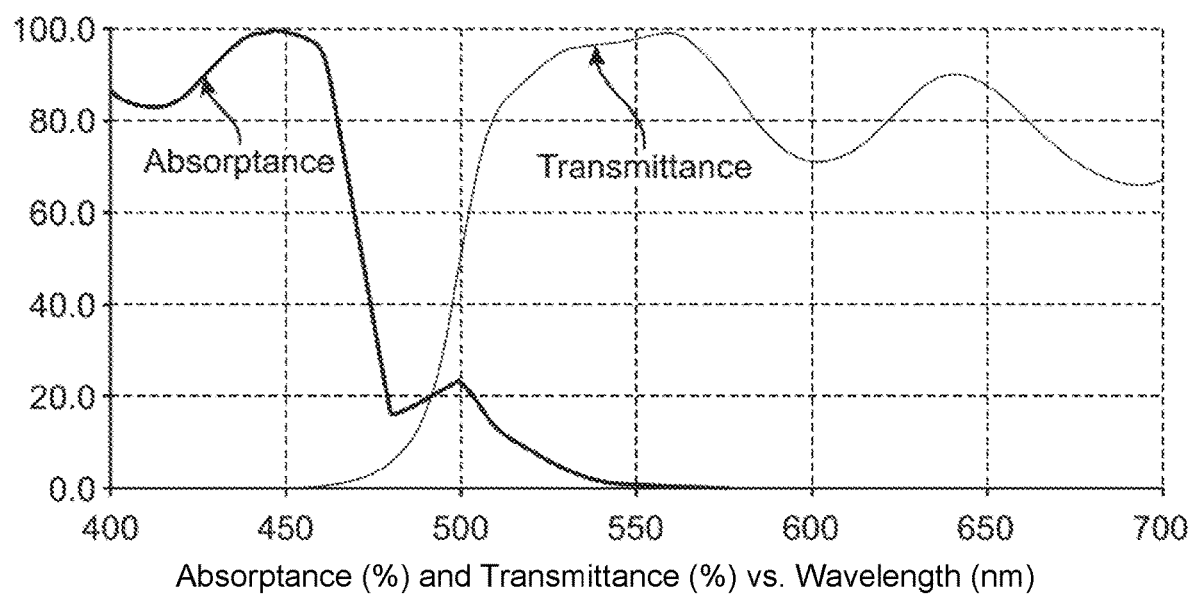
FIG. 12 is an overlay of absorptance and transmittance graphs for the optical layout of Design 1C.

FIG. 12 depicts an overlay of the absorptance and transmittance graphs for the simulation of the five QW stack with dielectric stack 1100 (FIG. 11). As seen in FIG. 12, nearly 100% of input pump light 712 (FIG. 11) was absorbed using the double-pass architecture provided by dielectric stack 1100 (FIG. 11), even with the removal of the additional about 300 nm of ZnSe provided in Design 1B. This makes the QW stack thinner and easier to fabricate. FIG. 12 also reveals that there was nearly complete transmission of outputted down-converted light 716 (FIG. 11). There was lower self-absorption due to the thinner QW stack.

Figure 13A:
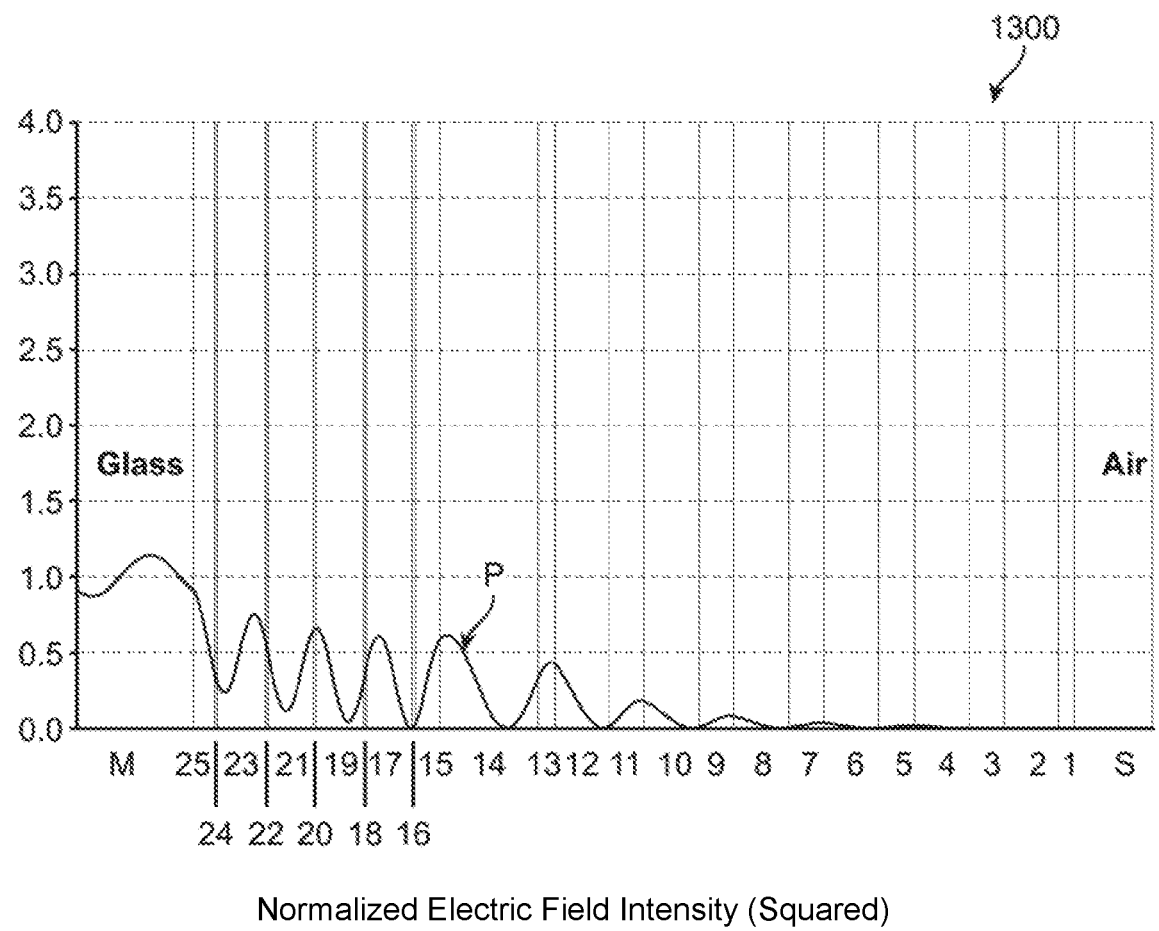
FIG. 13A is a graph of E-field intensity for the input pump light (450 nm) of Design 1C.
Figure 13B:
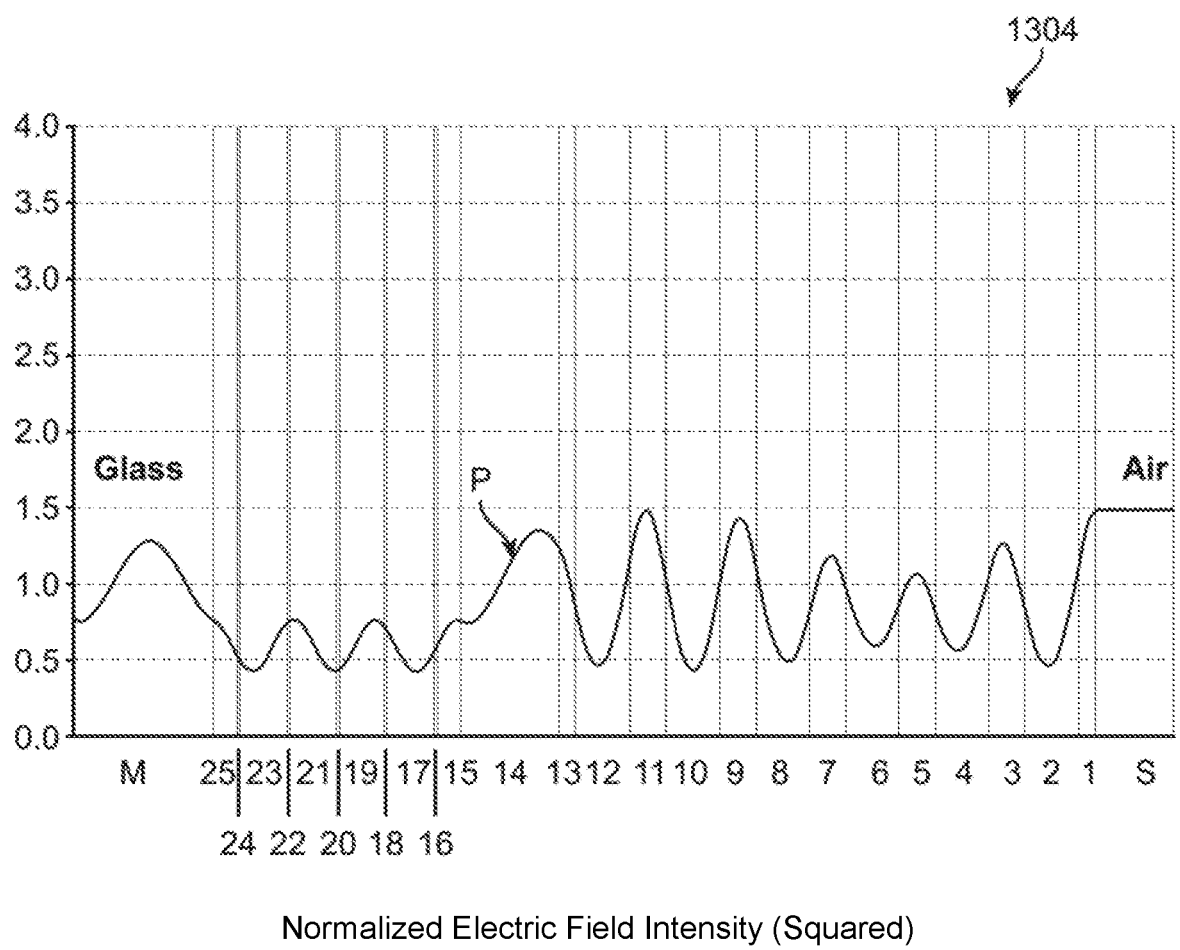
FIG. 13B is a graph of E-field intensity for the color-converted output light (545 nm) of Design 1C.
Figure 14:
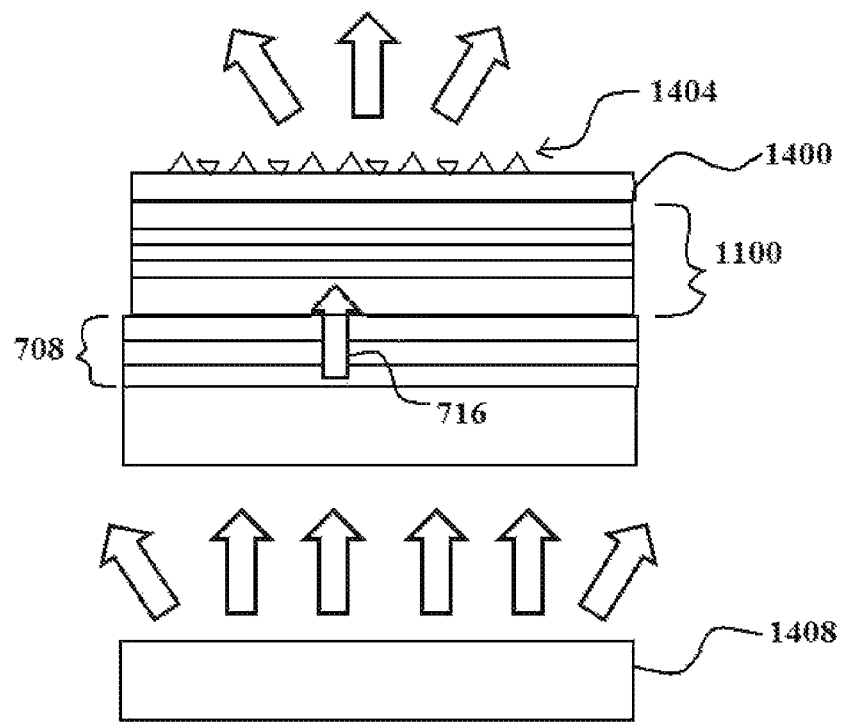
FIG. 14 is a diagram illustrating the optical layout of FIG. 11 with an additional "absentee" layer and texturing to allow for higher extraction of the color-converted light from the color-converted (CC) layer of the optical layout.

As was seen in the modeling, the E-field (electric field) penetration depth in the dielectric stack 1100 (FIG. 11) is wavelength dependent; input pump light 712 is reflected, and down converted output light 716 is transmitted. E-field intensity for the input pump light (450 nm) rapidly decayed after layer 4 of dielectric stack 1100, as modeled. See FIGS. 13A and 13B for E-field graphs 1300 and 1304 for, respectively, the 450 nm pump light 712 and the 545 nm down-converted light 716. Therefore and as shown in FIG. 14, an additional thin or thick film layer 1400 may be added to dielectric stack 1100 on the side facing air. The thickness of additional film layer 1400 may be "absentee layer thick" or any other thickness. The concept of "absentee" layers is known in thin film design and not elaborated upon here. This additional film layer 1400 may be textured (randomly or deterministically) with texturing 1404 to allow for higher extraction of down-converted output light 716 from CC layer 708.

The purpose of such texturing is to create a scattering mechanism to reduce/mitigate/TIR modes. This texturing could create regions of nano-structuring, or micro structuring, as desired by application and wavelength of light. The texturing can be created in-situ or ex-situ. In-situ texturing can be accomplished, for example, by surface/thin film roughening, and ex-situ texturing can be accomplished, for example, by incorporating nano-scatterers in a host matrix (like nano beads in a polymer thin film, etc.) and depositing that on dielectric stack 1100. Alternatively, the color converter die could be faceted or otherwise geometrically shaped on all of its sides, for example, by etching, etc. As another alternative, optical Gratings, photonic crystals, and metallic/dielectric corrugations or grids could also be incorporated in the additional film layer 1400 (FIG. 14) to enhance extraction efficiency of down-converted light 716.

It is noted that a similar strategy can be adopted at the surface facing pump-light source 1408 (FIG. 14). Scattering input pump light 712 will allow for larger cone angles of the pump light to get in and be absorbed by CC layer 708 so as to increase system efficiency.

Design 2

It is evident that in Designs 1A to 1C, above, that an equivalent to input-side coating 112 (FIG. 1) was not present. Following is a discussion of why such a coating is desirable.

Figure 15:
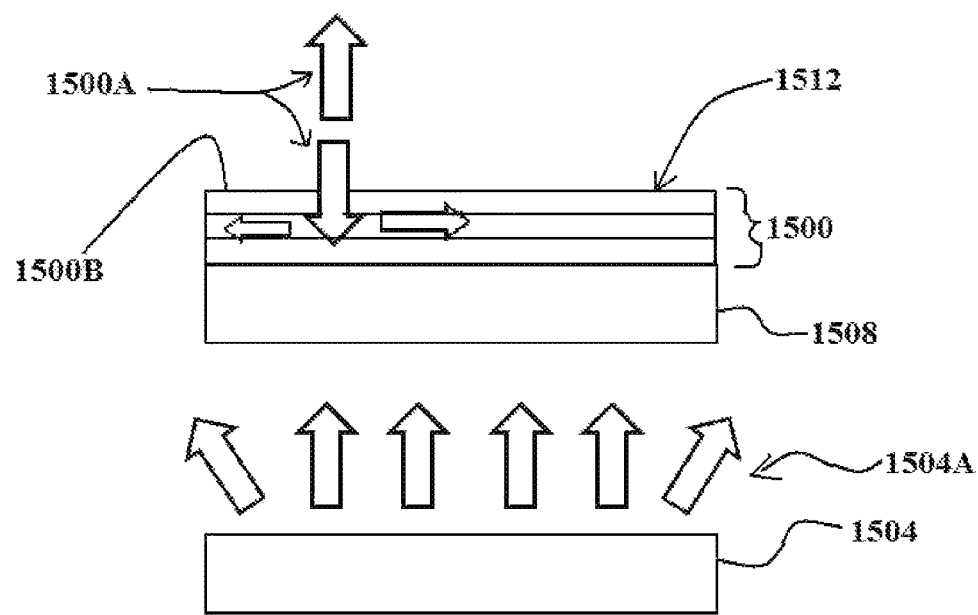
FIG. 15 is a diagram illustrating the behavior of the color-converted light generated by a CC layer.
Figure 16A:
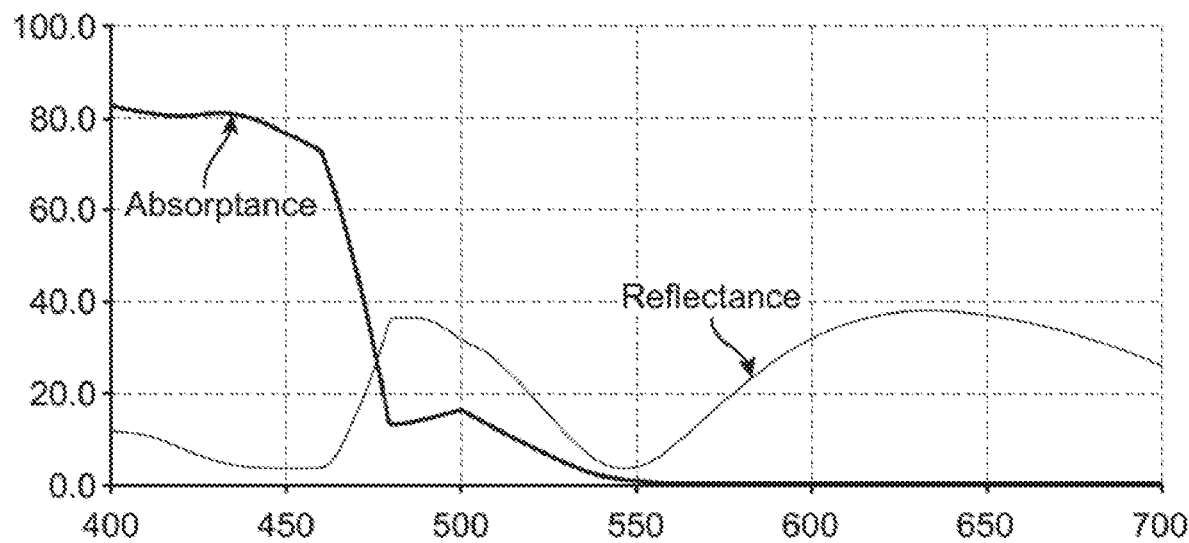
FIG. 16A is an overlay of absorptance and reflectance graphs at 550 nm for the optical layout of Design 1A at normal (0°) incidence.
Figure 16B:
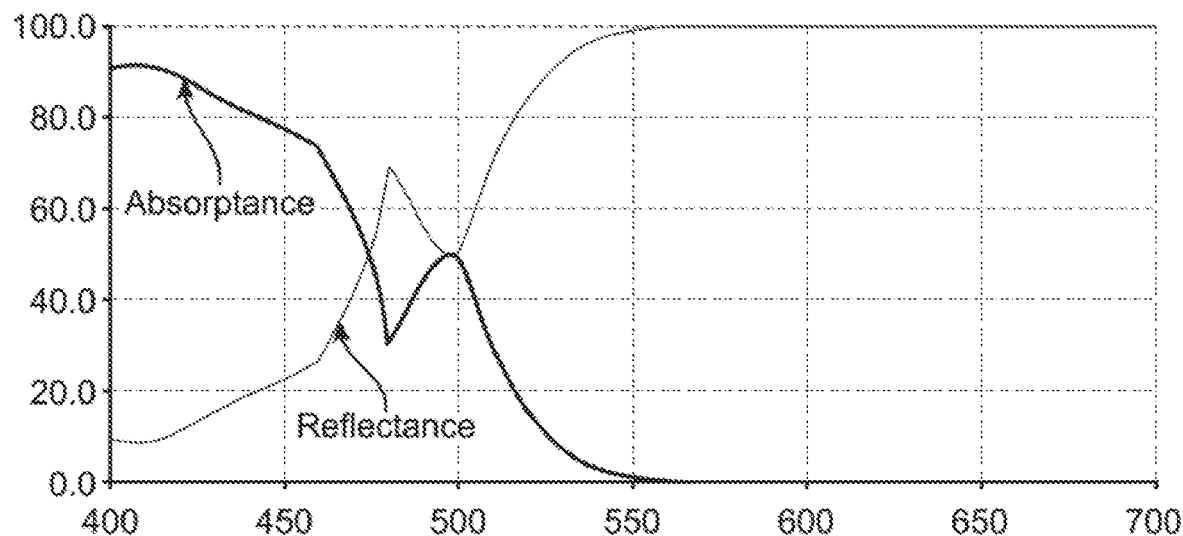
FIG. 16B is an overlay of absorptance and reflectance graphs at 550 nm for the optical layout of Design 1A at 50° incidence.

As illustrated in FIG. 15, the color-converted light 1500A generated by a CC layer 1500 from input pump light 1504A radiates in all directions in a full sphere. Clearly, the portion of color-converted light 1500A travelling "backwards" toward the substrate 1508 and pump-light source 1504 will be lost. Consequently, it is advantageous to redirect that portion of color-converted light 1500A toward the output side 1500B of CC layer 1500, which is on the output side of the overall light-emitting structure 1512. FIG. 16A depicts an overlay of absorptance and reflectance plots for the multi-quantum well structure on glass of Design 1A, above, at normal incidence (0 degrees). As should be apparent from FIG. 16A, the portion of color-converted light 1500A (FIG. 15) at 545 nm that is travelling backwards is simply transmitted back through substrate 1508. FIG. 16B depicts an overlay of absorptance and reflectance plots for the same multi-well quantum structure on glass at incidence of 50 degrees. Here, it is clear that about 22% of input light 1504A is reflected, and the remainder that is transmitted is absorbed inside CC layer 1500.

Figure 17:
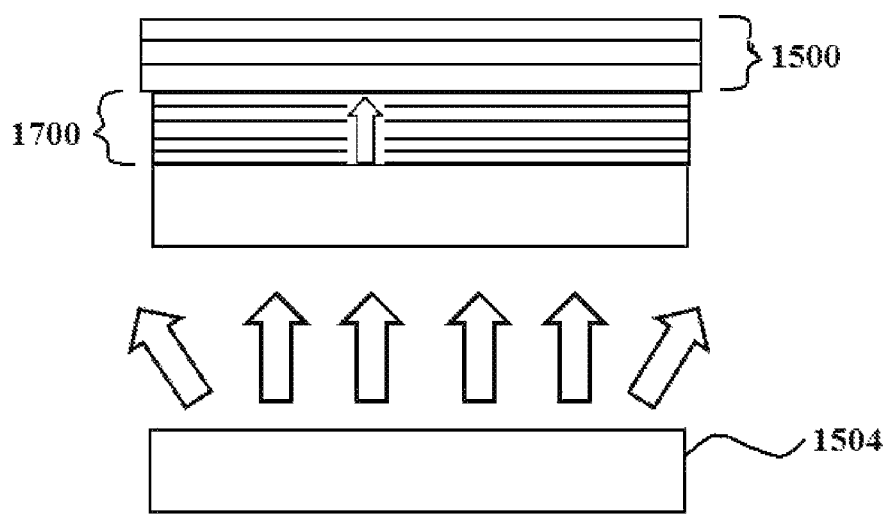
FIG. 17 is a diagram illustrating the optical layout of an example Design 2 of a light-emitting structure that includes a stack of dielectric films functioning as the input-side coating of the light-emitting structure of FIG. 1.

To mitigate the loss of color-converted light 1500A (FIG. 15) radiated toward substrate 1508 and the loss of input light 1504A reflected, the present inventor generated a Design 2 that adds a dielectric stack 1700 (FIG. 17) to CC layer 1500. Dielectric stack 1700 corresponds to input-side coating 112 of FIG. 1. In this design, the following parameters were used for the simulation in the TFCalc software:
   High Index material: $Nb_2O_5$ (n, k) is (2.3051, 0)
   Low Index material: $SiO_2$ (n, k) is (1.478, 0)
   Coating design:
      Glass+1.30 H (L H)^5 L 1.30 H L+5 QWs+Air
      H and L refer to quarter waves at a design wavelength of 580 nm.
      "^5" means that the layers in brackets were multiplied 5 times.

Figure 18:
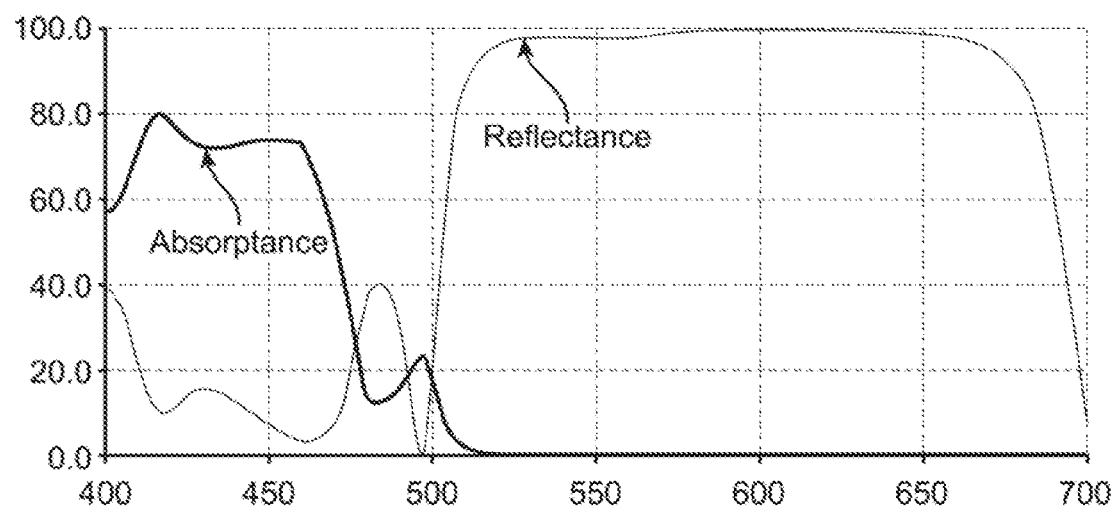
FIG. 18 is an overlay of absorptance and reflectance graphs at 550 nm for the optical layout of Design 2 at normal (0°) incidence.
Figure 19:
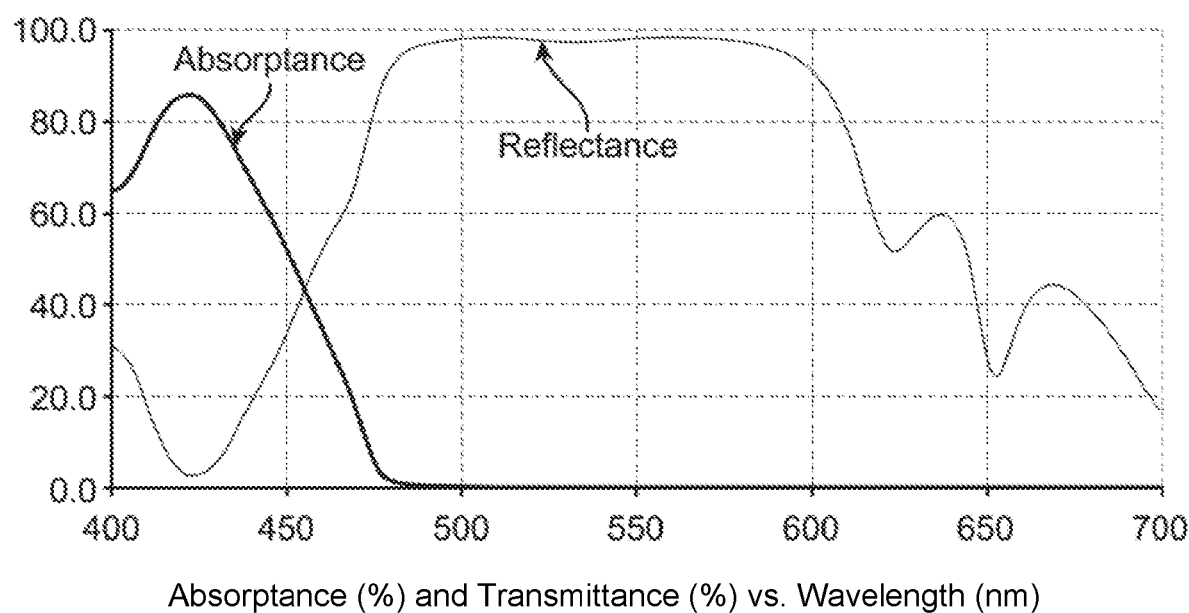
FIG. 19 is an overlay of absorptance and reflectance graphs at 550 nm for the optical layout of Design 2 at 30° incidence.

As noted above, the foregoing design parameters are for illustration only and should not be construed as being limiting in any way. FIGS. 18 and 19 are absorptance and reflectance overlays generated by the simulation for a reference wavelength of 550 nm at, respectively, an angle of 0 degrees and an angle of 30 degrees. As seen from FIGS. 18 and 19, at normal incidence and at higher angles of incidence, color-converted light 116A at ~545 nm from CC layer 116 that would normally travel backwards towards substrate 108 is now reflected and redirected towards the air interface at the output side of the CC layer (here, an equivalent to output-side coating 120 (FIG. 1) is not present), thereby increasing system efficiency. Dielectric coating stack 1700 (FIG. 17) depicted is called a "short pass" filter in optical thin film terminology. In lieu of a short pass filter, an optical band-pass filter might be used. Designs of these filters are well known in art and not detailed here, and those skilled in the art will readily understand how to incorporate any such suitable design into a light-emitting structure made in accordance with the present disclosure.

Figure 20A:
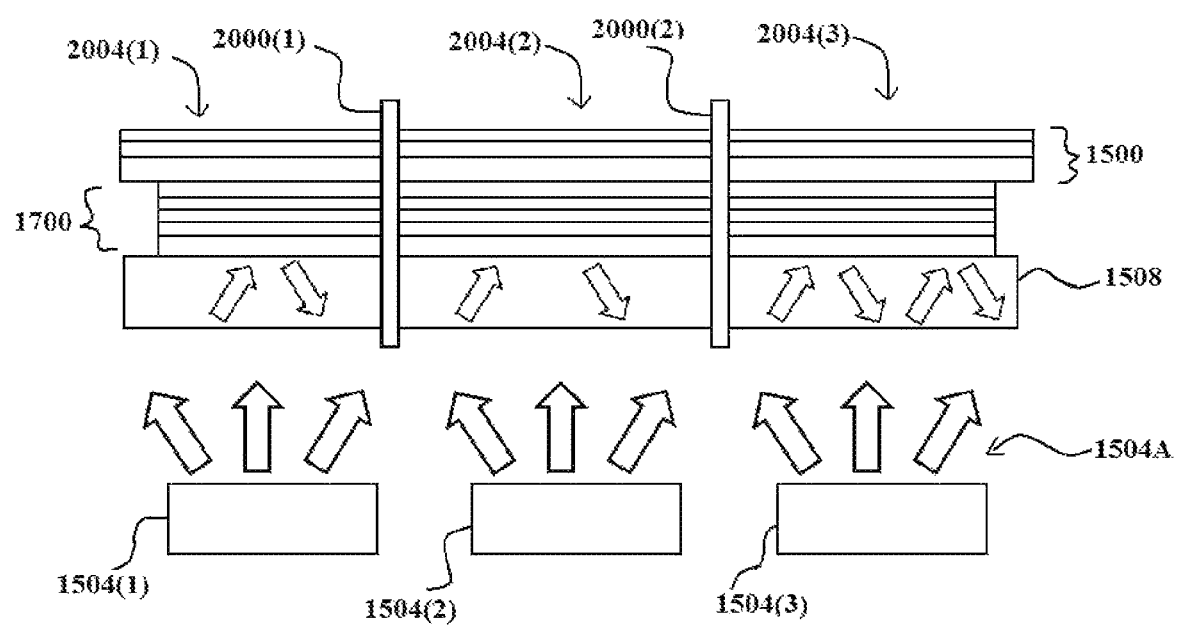
FIG. 20A is a diagram of the optical layout of FIG. 17 partitioned into pixels and including interpixel barriers to prevent pixel crosstalk and also showing behavior of the input pump light in the substrate.

As is clear from above, at higher angles of incidence, more and more of input pump light 1504A gets reflected sideways inside substrate 1508. Without proper barriers between pixels created inside substrate 1508, there will be significant inter-pixel crosstalk (noise). FIG. 20A illustrates the structure of FIG. 17 with pump-light source 1504 (FIG. 17) split into multiple pixel-based pump-light sources, here pump-light sources 1504(1) to 1504(3) (FIG. 20A), and with inter-pixel barriers, here inter-pixel barriers 2000 (FIG. 20A) added in each of CC layer 1500, dielectric stack 1700 (which also corresponds to input-side coating 112 of FIG. 1), and substrate 1508 to inhibit inter-pixel crosstalk.

Input pump light 1504A (FIG. 15) and color-converted light 1500A can seep into adjacent pixel elements, here adjacent pixel elements 2004(1) to 2004(3) (FIG. 20A). This "seeping," or crosstalk, into adjacent pixel elements 2004(1) to 2004(3), if it were to happen, would make the adjacent pixel elements appear to be lit, when in fact they are not. It is also important to have primary colors as pure as possible. Comingling of the crosstalk light can dramatically change the color coordinates of a pixel element. For example if input pump light 1504A (FIG. 15) is blue, and it seeps into one or more adjacent pixel elements that have a CC layer 1500 configured to convert the blue light to green light, some or all of that blue light might get converted to green light (i.e., color-converted light 1500A (FIG. 15)). In a microdisplay context, since the microdisplay is intended for NED (near eye display) applications and the human eye is significantly more sensitive to green light than to blue light (photopic vision), these pixel elements will appear falsely illuminated due to the seepage.

It is noted that some of the most favored optical architectures for NEDs utilize diffractive elements, such as holographic optical elements (HOEs), surface relief gratings, surface Bragg gratings, etc., to project light onto a viewer's eye. As is well known in optics, diffraction effects are spectrally sensitive. For an illuminated pixel, if it contains blue and green light simultaneously and post diffraction, the viewer will observe two pixels, one blue and one green, that are spatially separated. This artifact of diffraction is illustrated in FIG. 20C, which shows a pixel element 2040 that is supposed to emit pure blue light as a blue-light-emitting element of an RGB microdisplay 2044. However, in the illustrated example, the blue light generated by pixel element 2040 is contaminated by green light from an adjacent green-light-emitting pixel element, such as pixel element 2048 and/or pixel element 2052. When a diffractive optical element 2056 is optically located between microdisplay 2044 and a viewer (not shown), due to the diffractive effects fo the diffractive optical element, the viewer actually sees an image 2060 of pixel element 2040 that contains the two colors, here blue 2060(1) and green 2060(2), separated from one another. This diffractive effect requires optical systems (not shown), such as NEDs, to have microdisplays that have no crosstalk between pixel elements. It is challenging to prevent such crosstalk in micro-displays having sub-30 micron pixel elements, but various architecture and techniques disclosed herein can be implemented to prevent crosstalk.

Figure 20B:
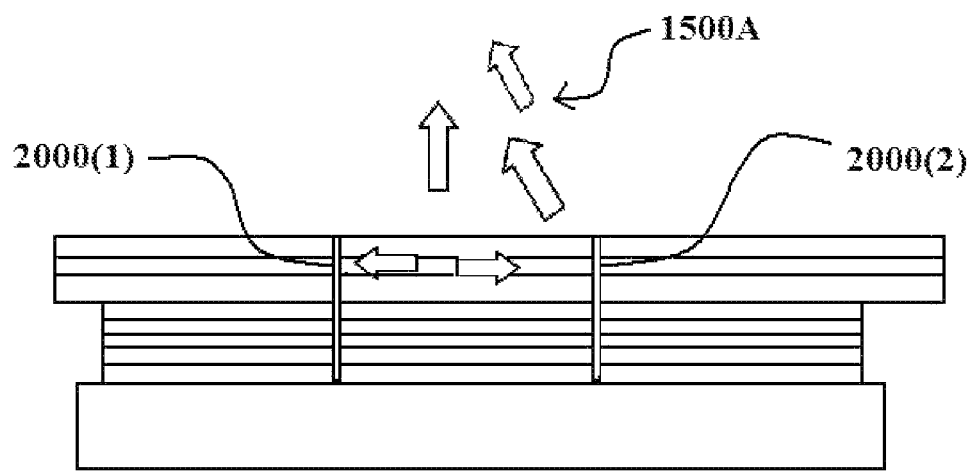
FIG. 20B is a diagram of the color-conversion structure of the portioned optical layout of FIG. 2A showing the behavior of the color-converted light within the CC layer.
Figure 20C:
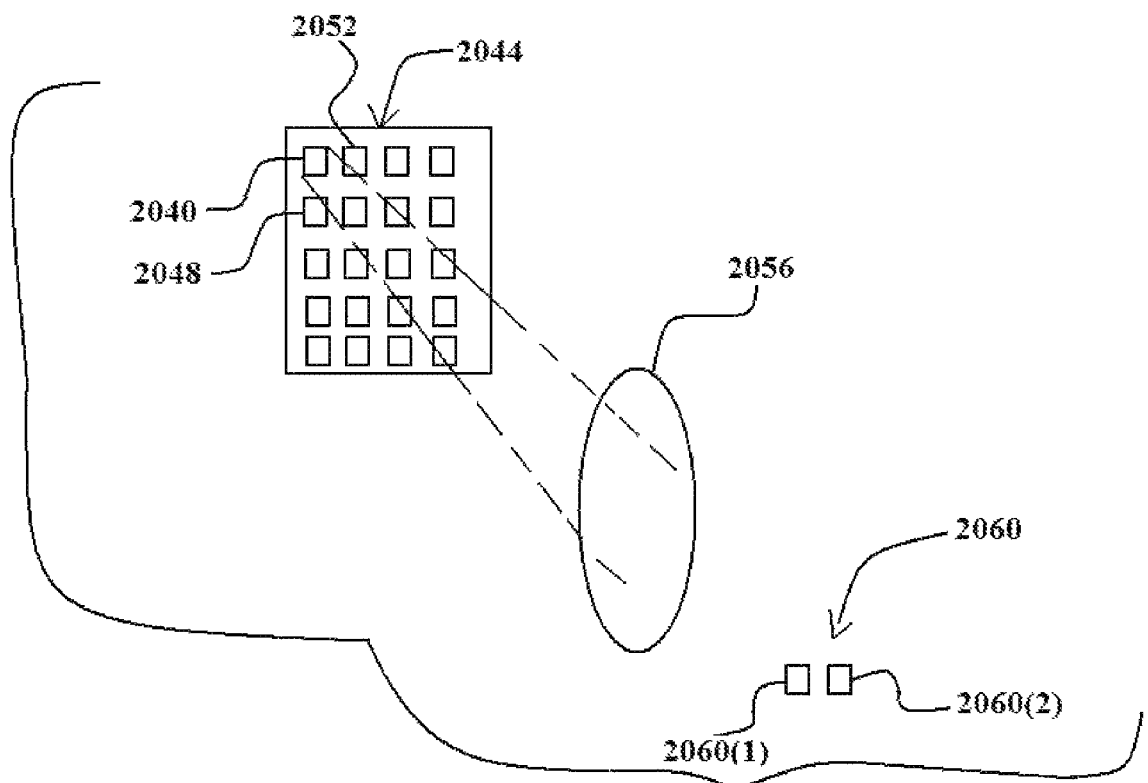
FIG. 20C is a diagram illustrating the effect that a diffractive optic element can have on a pixel element that is subject to cross-talk from an adjacent pixel element of a differing color.

Referring to FIG. 20B, opaque inter-pixel barriers, such as inter-pixel barriers 2000(1) and 2000(2), are desired to prevent input pump light 1504A (FIG. 20A) and color-converted light 1500A (FIG. 20B) from seeping into adjacent pixels. This "seeping" into adjacent pixels, if it were to happen, would make the adjacent pixels appear to be lit, when in fact they are not. This optical noise can be a severe nuisance in high resolution microLED visual displays and reduces the contrast ratio (bright versus dark) for such devices. Composition of black mask materials (organic, inorganic, semiconducting, and hybrids) can be used to create opaque inter-pixel barriers, such as inter-pixel barriers 2000(1) and 2000(2), and are well known in industry and not repeated here.

Coating-level barriers can be constructed, for example, by etching input- and output-side coatings 112 and 120 (FIG. 1) as well as CC layer 116 (FIG. 1). Once the etching is completed, the etched sections can be back filled with desired opaque barrier materials (absorbing black mask materials). Alternatively, reflecting mirror materials and texturing maybe employed to redirect the light outwards toward the output side of light-emitting device 100 (FIG. 1).

Etching techniques, as well as recipes for barrier materials, are widely known and in use and may include, but not be limited to, wet chemical etching processes, dry etching processes (such as reactive ion etching (RIE), plasma/planar etching, plasma enhanced etching (PE), inductively coupled plasma etching (ICP), deep reactive ion etching (DRIE), sputtering, ion enhanced etching, and ion beam milling), chemically assisted ion beam milling, electron cyclotron resonance plasma (ECR) etching, high density plasma (HDP) etching, microwave and RF plasma assisted etching, and laser induced/assisted chemical etching, among others. If used, the chemical source may be introduced as flood, time-varying, spatially varying, or continuous. While certain representative embodiments and details have been disclosed for purposes of illustrating the invention, it will be apparent to those skilled in the art that other etching/removal methods exists and may be used without departing from the scope of the invention, which is defined in the appended claims. Those skilled in the art will readily understand how to incorporate mask materials into the various elements of a light-emitting structure of the present disclosure, such as the structure illustrated in FIG. 20A.

It is noted that in some instances it may be challenging, if not impossible, to create very finely pitched inter-pixel barriers inside glass for very fine pixels (say, <50 micron pixels and/or <30 micron pixel elements), as would be required for high resolution, full color, NED microdisplays. By judicious design of a short-pass filter for input-side coating 112 (FIG. 1), higher incidence angle input pump light 104A (at some pre-determined angle and higher angles) can be completely reflected and guided to the outside the light-emitting structure. This would remove the need for opaque barriers in a glass substrate.

Figure 21:
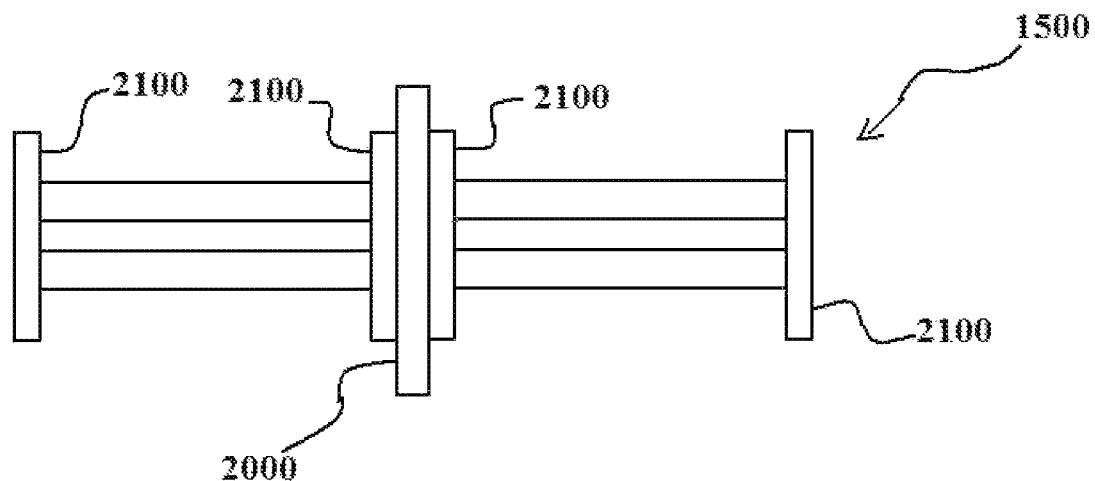
FIG. 21 is a diagram of a QW-based CC layer shown in isolation and illustrating the forming of interpixel barriers with the QW-based CC layer.

When quantum wells are used for color conversion, to reduce/mitigate dangling bonds and reduced color-conversion efficiency, it might be desirable to etch quantum wells of CC layer 1500 of FIG. 15 (depicted in isolation in FIG. 21) and overcoat the etched semiconductor surfaces with a wider bandgap semiconductor 2100 prior to forming inter-pixel barrier 2000. This will assist in passivating the dangling bonds on the quantum wells. Wider bandgap semiconductor 2100 may be any suitable semiconductor revealed in the description of CC layer materials described above, such as transparent semiconducting oxides such as: ZnO, $In_2O_3$, $SnO_2$, $Ga_2O_3$, CdO, $PbO_2$, InGaZnO, ZnSnO (ZTO), ITO, NIO, ZnInO (ZIO), $WO_3$, cadmium indium antimony oxide, other multi component amorphous oxides (MAOs), Perovskite type semiconductors, etc. Furthermore, the material(s) for wider bandgap semiconductor 2100 may be organic in nature. Additionally, processes like in-situ oxidation, or other surface treatments may be employed to reduce the dangling bonds. Besides reflecting barriers, additional defects/artifacts/structures, such as sub-wavelength gratings etc., may be included in CC layer 116 or proximate to it by creating such structures in input- and/or output layers 112 and 120 (FIG. 1). This will assist in redirecting any waveguided and/or total internal reflected light reaching inter-pixel barrier 2000 toward the output side of light-emitting structure 100 (FIG. 1).

Relative to the forgoing example Designs 1A to 1C and 2, the following is noted. In lieu of glass for substrate 108, any other substrate material, such as any of the substrate materials revealed above, may be utilized, as appropriate. Substrate 108 may also act as a heat sink or heat spreading material and may be, for example, diamond, diamond-like coating (DLC), mica, etc. The Zinc Blende II-VI QWs used in the simulation may be replaced by, for example, one or more Wurtzite II-VI QWs. In lieu of II-VI semiconductors, any direct bandgap semiconductors as noted above may be utilized, as appropriate. The QWs may be replaced by any other quantum confining layer (QCL), such as Quantum Dots (QDs). Additionally, combinations of QWs, QDs, etc., may be mixed together if so desired. The Band gaps of the QW material and the barrier layer material(s) may be chosen so that the input/pump wavelength is absorbed only in the QW layers (well or active layer) or also in the barrier layers. The QWs (if more than one) may be all of the same thickness or differing thicknesses and/or differing compositions. Similarly the barrier layers may be all of the same thickness or of differing thicknesses and/or compositions. Additional wider bandgap semiconductor materials may be grown/deposited around the barrier layers to increase down conversion efficiency and assist in passivation. The thin film interference coatings may be substituted by appropriate plasmonic structure(s), as desired.

The output wavelength(s) may be, for example, blue, green, red, or any wavelength in the visible and NIR electromagnetic spectra. The output wavelength may also be a combination of blue and green, or blue and red, or green and red, or blue green, and red (white light), or any other combination as desired in the visible and NIR region of the electromagnetic spectrum. The only requirement for input pump light 104A (FIG. 1) is that it be absorbed in CC layer 116, i.e., have a higher energy than the bandgap of the semiconductor/quantum confining layer and/or have an energy absorbable by one or more phosphors within the CC layer. Generally, the wavelength(s) of input pump light 104A can be any wavelength from DUV, UV, Violet, Blue, and the output wavelength(s) can be any wavelengths from the UV, Violet, Visible, to NIR or combinations of more than one wavelength(s) as dictated by the configuration of CC layer 116. In addition, the wavelength(s) of output light 100A can be tailored in terms of wavelength and bandwidth by choice of judicious design of CC layer 116 (e.g., the quantum confining layer(s)/barrier layers) to generate a specific color rendering index value, etc. It is noted that completed CC layer 116, input-side coating 112, optional output-side coating 120, and optional substrate 108, could be implemented as a stand-alone device or could be monolithically integrated along with pump-light source 104.

Embodiment 2

In the examples above, CC layer 116 (FIG. 1) is a monochrome color conversion layer for downconverting input pump light 104A of about 450 nm to color-converted light 116A (shown in FIG. 3) of about 545 nm, which is basically the color conversion of blue pump light to green color-converted light. However, to realize full-color RGB pixels with blue pump light, a CC layer would also need to also convert the blue pump light into a red color-converted light. In order to do that in a NED or other relatively small visual display, the CC layer needs fine pitched (small dimensions) green and red convertors next to each other in any physical pattern as desired by the application and layout.

The bandgap of a QW or other quantum-confined structure can be tailored by varying the thickness of the confined "well" layer and/or each of the barrier layers. In addition, the response of a quantum-confined structure can be tailored by varying the composition of the confined well layer. In one example, one could use the QW design noted above relative to Design 1A and increase the well thickness layer, i.e., the $ZnCd_xSe_{1-x}$ layer, from 2.95 nm to a larger value to move the photoluminescence emission from 536.5 nm to greater than 600 nm. The exact value is highly dependent on the cadmium concentration and the thickness of the barrier layers.

Figure 22A:
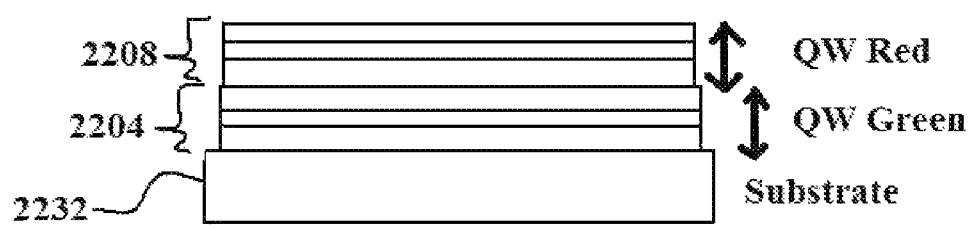
FIGS. 22A to 22F are diagrams illustrating various stages of fabricating a red-green-blue (RGB) light-emitting structure made in accordance with aspects of the present disclosure and having portions of differing CC layers removed to create red, green, and blue emitting regions.
Figure 22B:
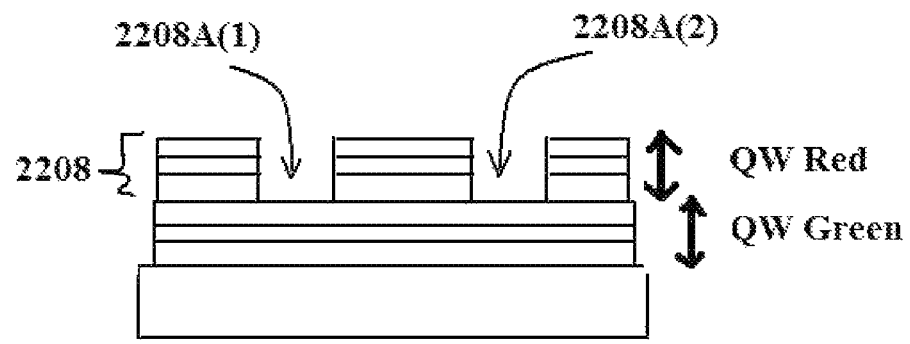
Figure 22C:
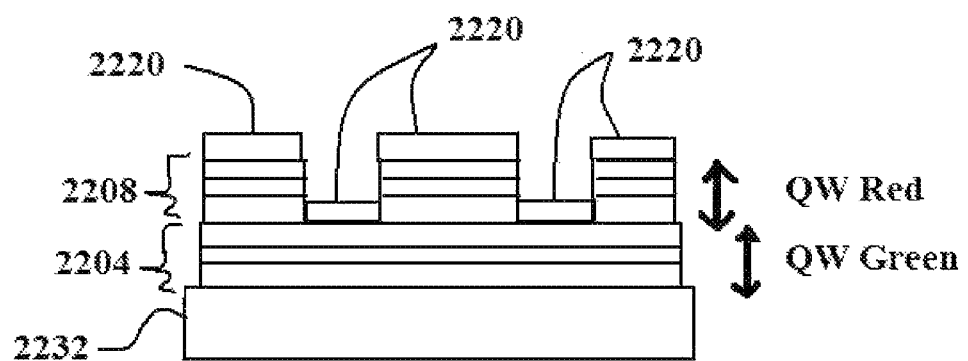
Figure 22D:
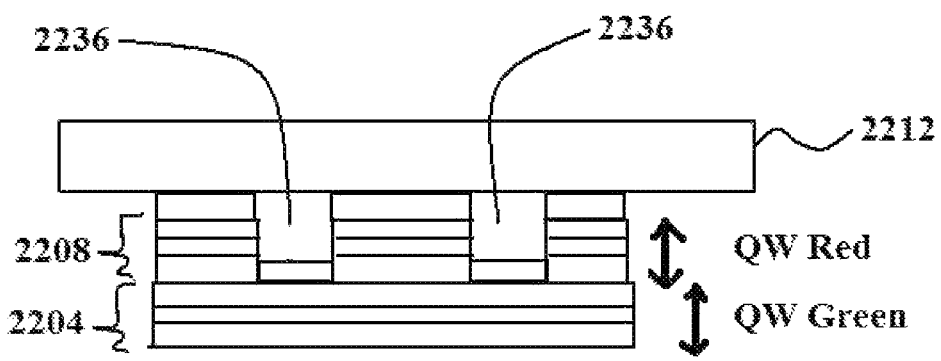
Figure 22E:
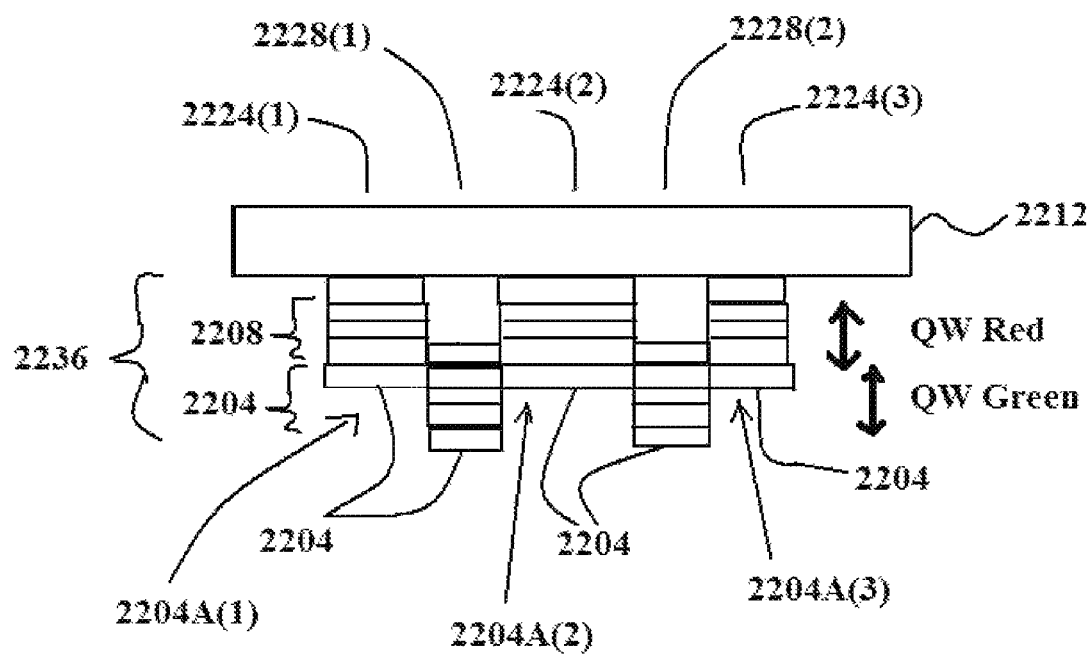
Figure 22F:
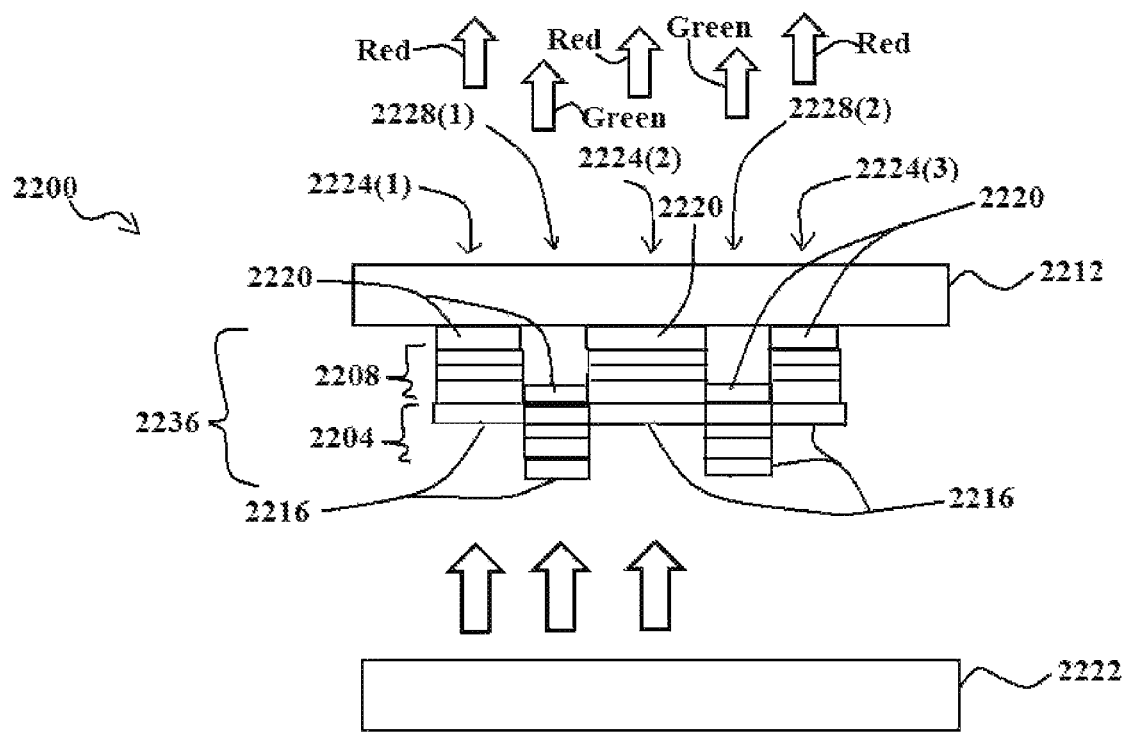

As illustrated in an example light-emitting structure 2200 of FIG. 22F and using the same design logic as described above for Design 1A, an appropriate blue-to-red color-converting multi-QW (QW red) stack 2204 can be designed, index matched, optimized, and directly deposited (and/or transferred onto) a blue-to-green color-converting multi-QW (QW-green) stack 2208, or vice versa. In the example shown in FIG. 22F, QW red and QW green stacks 2204 and 2208 are engaged with a substrate 2212. This example also shows light-emitting structure 2200 as including input- and output-side coatings 2216 and 2220, as well as a pump-light source 2222. In this example, light-emitting structure 2200 is shown as including five pixel elements composed of three red pixel elements 2224(1) to 2224(3) and two green pixel elements 2228(1) and 2228(2), with the pixel elements generally being defined by the presence of a corresponding portion of one of QW red stack 2204 and QW green stack 2208 and the absence of a corresponding portion of the other of the QW red and QW green stacks. FIGS. 22A to 22E illustrate steps that can be performed in fabricating light-emitting structure 2200 of FIG. 22F.

Initially and referring to FIG. 22A, QW green stack 2204 is formed on a temporary substrate 2232, and QW red stack 2208 is formed on the QW green stack, such as using the QW architecture noted above. Then, as illustrated in FIG. 22B, portions 2208A(1) and 2208(2) of QW red stack 2208 are removed using any suitable selective removal technique(s) at the desired pixel element pitch(es) to create the structure shown in FIG. 22B. As seen in FIG. 22C, output-side coating 2220 is provided atop the previously patterned QW red stack 2208 and now-exposed portions of QW green stack 2204. Following the addition of output-side coating 2220, in this example the coated assemblage is transferred onto substrate 2212 (FIG. 22D), and temporary substrate 2232 (FIG. 22C) is removed. In this example, the coated assemblage is bonded to substrate 2212 using any suitable bonding technique, here involving a bonding agent 2236, which can be any suitable bonding agent known in the art.

As seen in FIG. 22E, following exposure of QW green stack 2204 by the removal of temporary substrate 2232 (FIG. 22C), portions 2204A(1) to 2204A(3) are removed using any suitable selective removal technique(s) so as to create the regions corresponding to three red pixel elements 2224(1) to 2224(3) and two green pixel elements 2228(1) and 2228(2). It is noted that while FIG. 22C and other similar figures herein portray the height differences between the remaining portions of QW green stack 2204 and QW red stack 2208, it is worth noting that for all practical purposes the QW green and QW red stacks are coplanar in many instantiations because they are so thin, such as on the order of 500 nm or less. Following removal of temporary substrate 2232 (FIG. 22C), input-side coating 2216 is applied to the exposed portions of QW green and QW red stacks 2204 and 2208. At this point, the fabrication of the color-conversion structure portion of light-emitting structure 2200 of FIG. 22F may be considered complete. At some point, pump-light source 2222 is provided to create the entire light-emitting structure 2200. As with other embodiments, pump-light source 2222 may be monolithically integrated with the color-conversion structure or be separate therefrom. It is noted that in this embodiment, the portions of QW green and QW red stacks 2204 and 2208 that remain after material removal, as well as the portions of these stacks that are present at any processing step, are collectively referred to as a CC layer, here CC layer 2236 as seen in each of FIGS. 22A to 22F.

Relative to the forgoing embodiment 2, the following is noted. As before, the zinc blende II-VI QWs revealed may be replaced by Wurtzite II-VI QWs. Transfer substrate 2232 (FIG. 22C) may be comprised of any substrate material already revealed in this disclosure. The same techniques can be expanded to realize color conversion layers with more than two colors, side by side. Deposition sequence of input-side coating 2216 and output-side coating 2220 may be reversed, depending on whether it is desirable to have the transfer substrate facing input pump radiation (not shown) or facing away from the input pump radiation (not shown). It might or might not be possible to deposit/grow QW red stack 2208 directly on top of QW green stack 2204 due to issues with lattice matching and the quality of the deposited QWs. In such a case, the QW red stack 2208 can be made/deposited/grown on a separate substrate and then bonded (face to face) using any known bonding technique, including optical bonding and fusion bonding, Van der Waals bonding, etc. to create the QW red and QW green combined stack (i.e., CC layer 2236) as depicted in FIGS. 22A to 22F.

Regarding bonding techniques, there are many ways to bond two substrates/coatings together. These techniques include, but are not limited to, chemical bonding using epoxies, adhesives, RTV, silicones, urethanes, etc. These techniques may also include water or solvent soluble epoxies, adhesive, etc. These chemical may be cured/activated using plasma, light, UV, temperature, pressure, anaerobic environment, etc. Bonding may also be initiated by surface treatments using chemicals, activated plasma treatments, vacuum processes, etc. Bonding processes may also include microwave bonding, anodic bonding, fusion bonding, adhesive, eutectic, resist, solder, thermocompression and/or low temperature glasses. While certain representative embodiments are noted for purposes of illustrating a point, it will be apparent to those skilled in the art that bonding methods not disclosed herein may be used without departing from the scope of the invention.

Etching techniques, as well as recipes for coating materials, are widely known and in use and may include, but not be limited to, wet chemical etching processes, dry etching processes (such as reactive ion etching (RIE), plasma/planar etching, plasma enhanced etching (PE), inductively coupled plasma etching (ICP), deep reactive ion etching (DRIE), sputtering, ion enhanced etching, and ion beam milling), chemically assisted ion beam milling, electron cyclotron resonance plasma (ECR) etching, high density plasma (HDP) etching, microwave and RF plasma assisted etching, and laser induced/assisted chemical etching, among others. If used, the chemical source may be introduced as flood, time-varying, spatially varying, or continuous. While certain representative embodiments and details have been disclosed for purposes of illustrating the invention, it will be apparent to those skilled in the art that other etching/removal methods exists and may be used without departing from the scope of the invention, which is defined in the appended claims. Those skilled in the art will readily understand how to incorporate mask materials into the various elements of a light-emitting structure of the present disclosure, such as the structure illustrated in FIG. 22F.

Figure 22G:
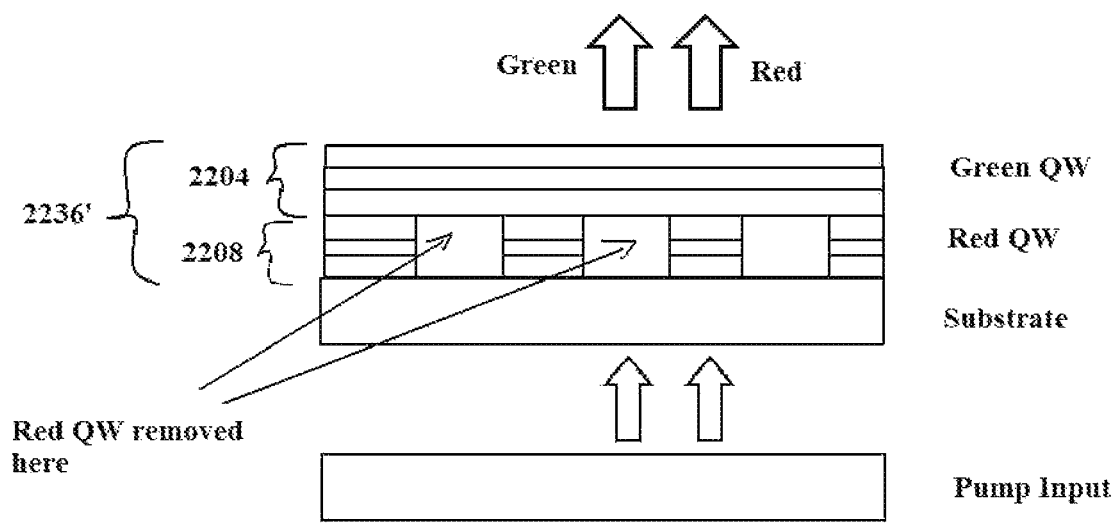
FIG. 22G is a diagram illustrating the light-emitting structure similar to light-emitting structure of FIGS. 22A to 22F but with the QW green and QW red stacks reversed relative to FIGS. 22A to 22F, which allows the etching of the QW green stack to be eliminated due to its transparency to the red light generated by the QW red stack.

A higher-bandgap QW will typically be transmissive to lower-bandgap photons. For the optical construction shown in FIG. 22A, this means that QW green stack 2204 will be transmissive to red light emitted from QW red stack 2208. The layout can be reversed as shown in FIG. 22G where QW green stack 2204 is now on top of QW red stack 2208. Because QW green stack 2204 is transmissive to the red light emitted from QW red stack 2208, the etching of QW green stack 2204 can be eliminated for regions where red light is to be emitted. This can reduce the number or processing steps needed to create CC layer 2236' In addition, the permutations described in the notes in embodiment 1 are also applicable to this Embodiment 2.

Embodiment 3

Figure 23:
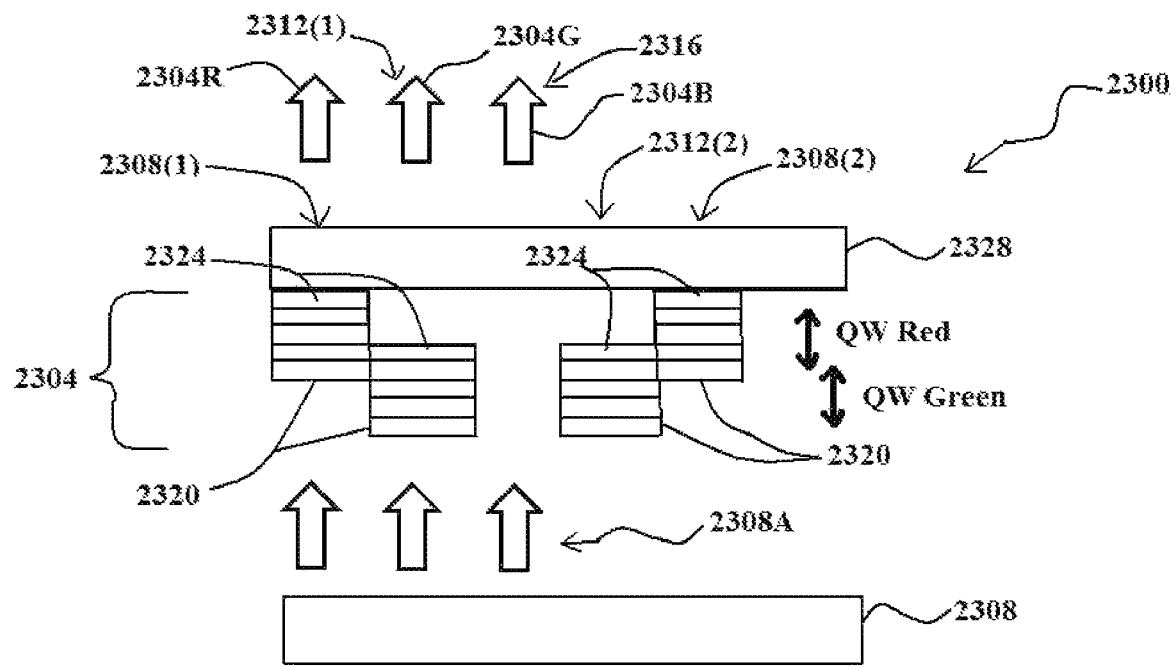
FIG. 23 is a diagram illustrating an alternative RGB light-emitting structure having portions of differing CC layers removed to create red, green, and blue emitting regions.
Figure 24:
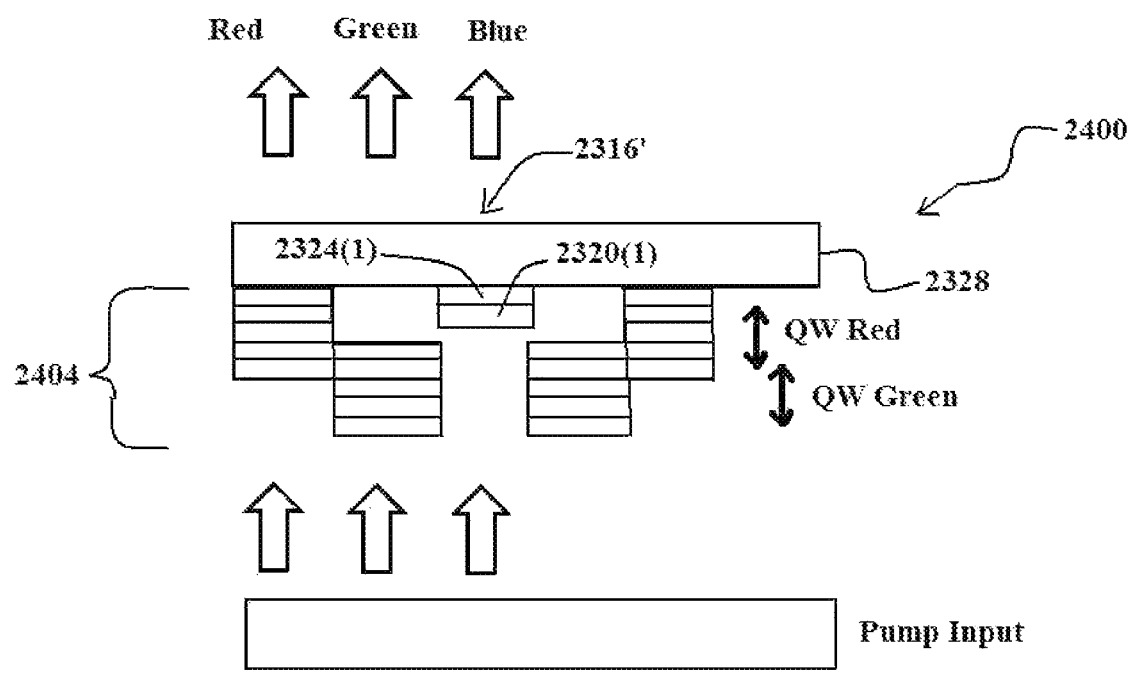
FIG. 24 is a diagram illustrating another alternative RGB light-emitting structure having portions of differing CC layers removed to create red, green, and blue emitting regions.

In examples above, the CC layer is either monochromatic (CC layer 116 of FIG. 1) or bichromatic (CC layer 2236 and 2236' of FIGS. 22F and 22G, respectively) for downconverting input pump light of about 450 nm wavelength to, respectively, green color-converted light or green and red color-converted light. However, depending on the desired application and choice of input pump light, to realize full color RGB pixels, the CC layer might need to also transmit the input light (e.g., blue light) unhindered. In one example, shown in FIG. 23, a light-emitting structure 2300 includes a trichromatic CC layer 2304 composed of an RGB stack that downconverts a blue input pump light 2308A from a pump-light source 2308 to each of red color-converted light 2304R and green color-converted light 2304G at corresponding pixel elements, here pixel elements 2308(1) 2308(2) and 2312(1) and 2312(2), and also allows the original blue input light to pass through unconverted at one or more corresponding pixel elements, here pixel element 2316. In the embodiment of FIG. 23, portions of input- and output-side coatings 2320 and 2324, respectively, are not present on substrate 2328 at blue pixel element 2316. FIG. 24 illustrates another example of a light-emitting structure 2400 that includes a trichromatic CC layer 2404 similar to trichromatic CC layer 2304 of FIG. 23. However, in light-emitting structure 2400, portions 2320(1) and 2324(1) of input- and output-side coatings 2320 and 2324 are present on substrate 2328 at blue pixel element 2316'.

Figure 25:
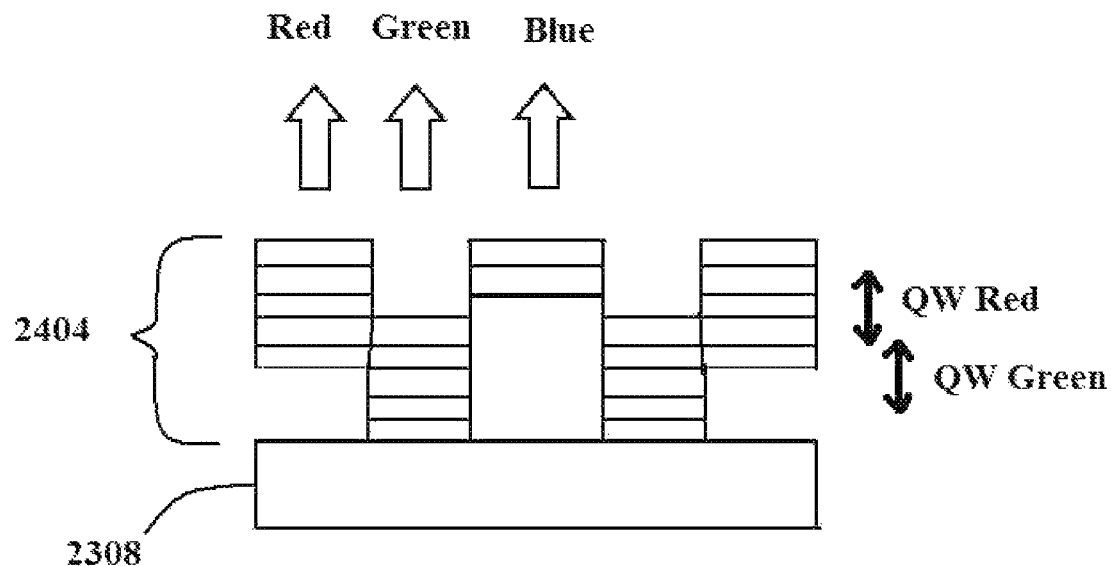
FIG. 25 is a diagram illustrating yet another alternative RGB light-emitting structure having portions of differing CC layers removed to create red, green, and blue emitting regions.

It is to be understood that transfer substrate 2328 (FIGS. 23 and 24) itself might be a temporary substrate. This situation is illustrated in FIG. 25 in which substrate 2328 (FIGS. 23 and 24) has been removed and the remaining structure, here, trichromatic CC layer 2404 of FIG. 24, is transferred/bonded/attached/affixed directly atop input pump light source 2308 (e.g., LD, LED, microLED, etc.) without the transfer substrate. Those skilled in the art will readily appreciate that the color-conversion structure of each light-emitting structure 2300, 2400 of FIGS. 23 and 24, respectively, can be fabricated in the same or similar manner described above in connection with forming the color-conversion structure of light-emitting structure 2200 of FIGS. 22A to 22F.

Although the depictions in FIGS. 23 to 25 show large height variations between the QW stacks, it is worth nothing that these sections are mostly co-planar because they are so thin. Thus, these figures are for illustration purposes only. Furthermore, the permutations described above relative to Embodiments 1 and 2 are also applicable to this embodiment.

Embodiment 4

Figure 26:
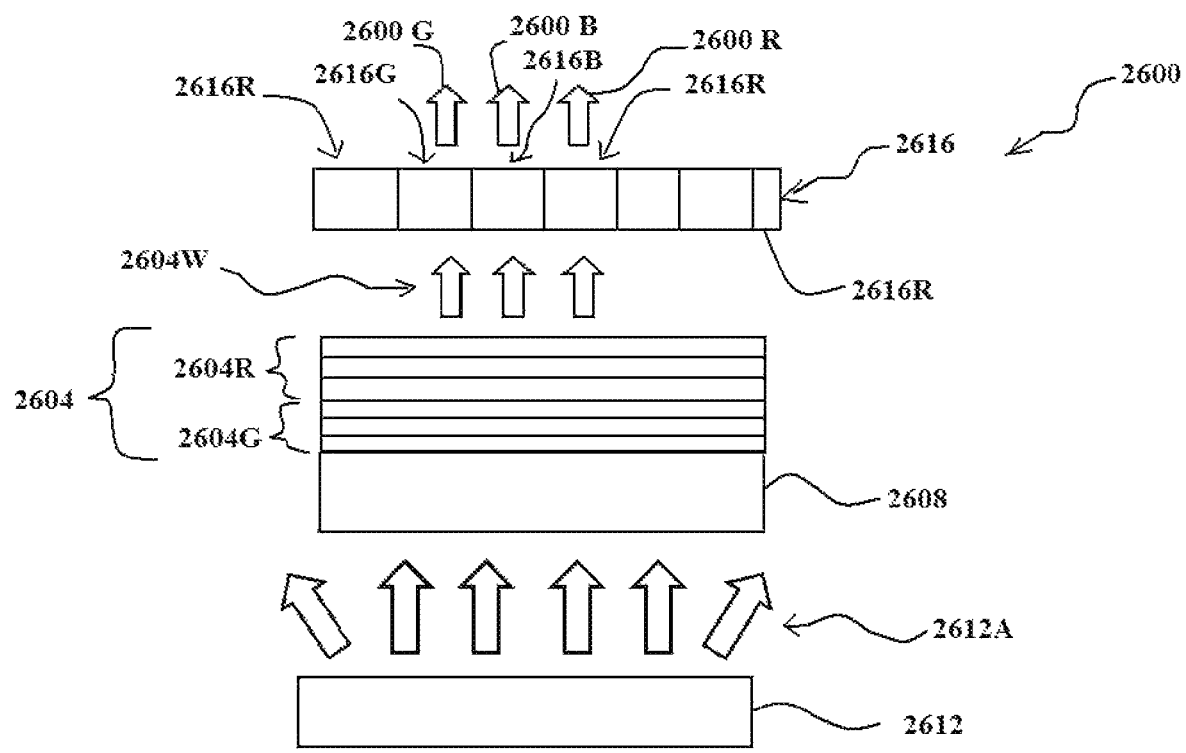
FIG. 26 is a diagram illustrating an RGB light-emitting structure having continuous differing CC layers that together generate white light, which is then filtered using a spectrally selective filter to create red, green, and blue emitting regions.

In examples above, CC layers are provided with discrete pixel elements according to the colors of the output light, such as red, green, and blue. In those examples, each CC layer includes sets of color-conversion sublayers, portions of which are removed to creating the differing-output-color pixel elements. In embodiment 4, portions of the sets of color-conversion sublayers are not removed. Rather, they are designed to be continuous and absorb only a portion of the pump light. FIG. 26 illustrates an example of such an embodiment.

As seen in FIG. 26, light-emitting structure 2600 includes a CC layer 2604, here composed of a QW green stack 2604G and a QW red stack 2604R. In this example, CC layer 2604 is applied directly to a substrate 2608, and a pump-light source 2612 is present proximate to the substrate. It is noted that in other instantiations, substrate 2608 may be in a different location relative to pump-light source 2612 and one or more other layers, such as an input-side coating and/or an output-side coating, that are the same as or similar to, respectively, input- and output-side coatings 112 and 120 of FIG. 1. That said, it is noted that in this embodiment, a goal of light-emitting structure 2600 is for some of input pump light, here blue light 2612A, to pass all the way through CC layer 2604 so that it can combine with the green output light 2600G of QW green stack 2604G and the red output light of QW red stack 2604R to create white light 2604W. In this example, light-emitting structure 2600 includes a spectrally selective filter 2616 to filter white light 2604W so as to create red, green, and blue pixel elements 2616R, 2616G, and 2616B, respectively, that output, respectively, red, green, and blue output light 2600R, 2600G, and 2600B. It is noted that spectrally selective filter 2616 may be of an absorptive type or of an interference type. Spectrally selective filter 2616 may also be composed of plasmonic coatings or particles. In addition to adding input- and/or output coatings as noted above, inter- and/or intra pixel cross-talk barriers (not shown, but the same as or similar to barriers 2000(1) and 2000(2) of FIGS. 20A and 20B can be incorporated into light-emitting structure 2600.

As noted above, each of QW green stack 2604G and QW red stack 2604R are designed so as to allow a portion of blue pump light 2612A to pass all of the way through CC layer 2604 so that the resulting output of the CC layer is white light 2604W. The proportions of red, green, and blue photons combining to form white light 2604W can be tailored as desired or needed for the particular application at issue. The architecture illustrated in light-emitting structure 2600 of FIG. 26 can be optically inefficient. Each subpixel sees white light 2604W, which is then filtered by spectrally selective filter 2616. Consequently, generally about 66% of the light is lost at least sub-pixel by removing the red, green, or blue components from white light 2604W for that sub-pixel. In addition, there are typically losses due to mismatch of the spectral profile of spectrally selective filter and the color-converted spectra. It is noted that permutations described above relative to Embodiments 1-3 can be applicable to this embodiment 4.

Embodiment 5

Figure 27:
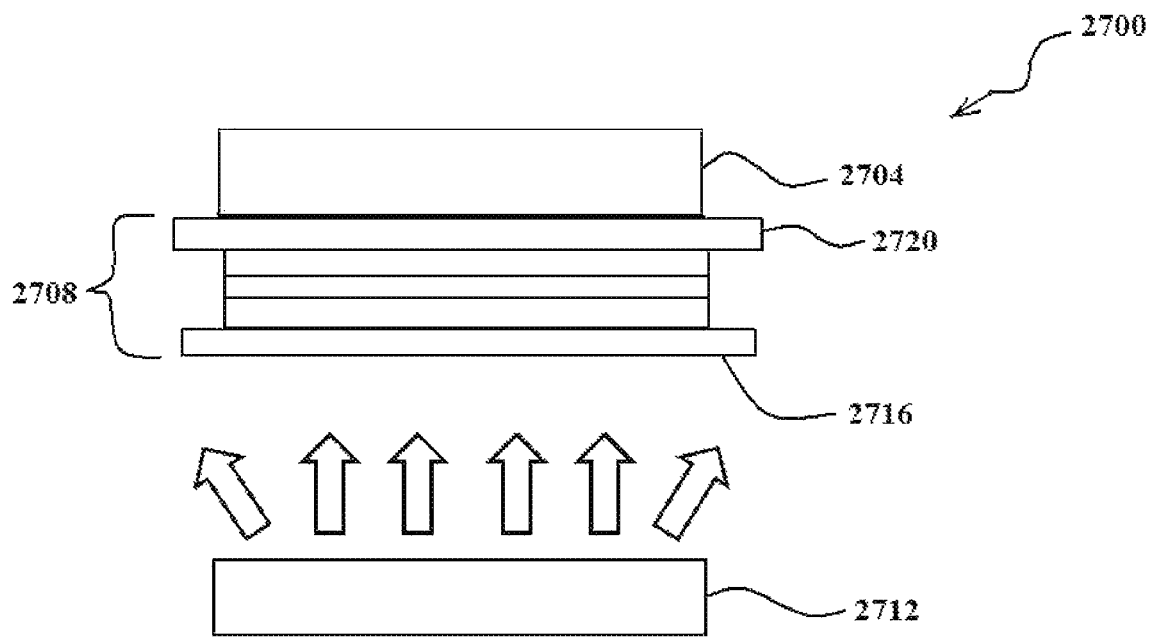
FIG. 27 is a diagram illustrating a variant of the light-emitting structure of FIG. 1 that has the substrate on the output side of the CC layer.

As seen in FIG. 1, substrate 108 of light-emitting structure 100 is located between pump-light source 104 and CC layer 116. FIG. 27 illustrates a light-emitting structure 2700 having a substrate 2704 located on the side of CC layer 2708 opposite from input pump-light source 2712. Light-emitting structure 2700 also includes an input-side coating 2716 and an output-side coating 2720 that are the same as or similar to input- and output-side coatings 112 and 120 of light-emitting structure 100 of FIG. 1. It is noted that input- and output-side coatings 2716 and 2720 are in the same positions relative to CC layer 2708 and pump-light source 2712 as input- and output-side coatings 112 and 120 (FIG. 1) are relative to CC layer 116 and pump-light source 104. A difference between input- and output-side coatings 2716 and 2720 on the one hand and input- and output-side coatings 112 and 120 on the other is the index matching given the differing relative locations of substrate 2704 and pump-light source 2712. As those skilled in the art will readily appreciate, the permutations described above relative to Embodiments 1-4 are also applicable to this embodiment 5.

Embodiment 6

In many of the foregoing embodiments and examples thereof, the respective CC layers are composed on quantum confining layers, such as QW layers. However, in the present embodiment, the quantum-confining-layers of the prior embodiments can be replaced with suitable photoluminescent (PL) phosphor layers. Many semiconductor materials in thin film form may be used as PL phosphor layers, even though these films suffer from self-absorption and other intrinsic inefficiencies. These semiconductor thin films may be composed of any of the materials as outlined in the CC-layer section above. These films may be single crystal, polycrystalline, preferentially oriented, textured, micro or nano crystalline or amorphous is morphology. As particular examples, the present inventor proposes to use the well-researched wide band gap II-VI materials in CC layers of light-emitting structures and color-converting components of the present disclosure. Since II-VI semiconductors have direct energy gaps and large effective mass they are very efficient in light absorption and emission. The II-VI materials may be composed of binary, ternary or quarternary combinations such as, but not limited to ZnS, ZnSe, ZnSSe, ZnTe, ZnSTe, ZnSeTe, CdS, CdSe, CdTe, CdSSe, CdSTe, CdSeTe, HgS, HgSe, and HgTe, among others. Those skilled in the art will readily appreciate that the permutations described above relative to Embodiments 1-5 are also applicable to this embodiment 6.

Example Material Combinations for QW-Based CC Layers

Several combinations of materials for QW-based CC layers were presented above. Following are more combinations of semiconductor materials that may be used for creating QW-based CC layers of light-emitting structures and/or color-conversion structures of the present disclosure, including those illustrated in the appended drawings and those described or otherwise noted in this disclosure. Those skilled in the art will readily appreciate that the material combination presented herein are not limiting in any way, but rather are provided for the sake of example. These material combinations can be used to create high-quality, fine-pitched micro-displays using the color-conversion architectures disclosed herein.

Combination 1
Material class: II-VI (Zinc Blend Phase)
Quantum confining well layer: $Zn_xCd_{1-x}Se$
Quantum confining barrier layer: $Zn_xCd_{1-x}Se$, ZnSe or ZnS or $Mg_{1-x}Zn_xS_{1-y}Se_y$, or $Zn_xCd_{1-x}S_{1-y}Se_y$
Substrate: GaAs (100)
Color: blue, green, or red by increasing ratio of Cd in well layer and/or increasing barrier layer thickness and modifying Se concentration Combination 2
Material class: II-VI (Zinc Blend Phase)
Quantum confining well layer: $Zn_xCd_{1-x}S_{1-y}Se_y$
Quantum confining barrier layer: $Zn_xCd_{1-x}S_{1-y}Se_y$, ZnSe or ZnS or $Mg_{1-x}Zn_xS_{1-y}Se_y$, or $Zn_xCd_{1-x}Se$
Substrate: GaAs (100)

Color: blue, green, or red by increasing ratio of Cd in well layer and/or increasing barrier layer thickness and modifying Se concentration Combination 3
Material class: II-VI (Zinc Blend Phase)
Quantum confining well layer: $Mg_{1-x}Zn_xS_{1-y}Se_y$
Quantum confining barrier layer: $Mg_{1-x}Zn_xS_{1-y}Se_y$, ZnSe or ZnS
Substrate: GaAs (100)
Color: blue or green by increasing ratio of Se in well layer and/or increasing barrier layer thickness Combination 4
Material class: II-VI (Wurtzite Phase)
Examples: Wurtzite Phase of materials of Combinations 1-3, above
Substrate: GaSe or other layered material Combination 5
Quantum confining well layer: GaSe, GaS or $GaS_xSe_{1-x}$ (Wurtzite/Hexagonal Phase)
Quantum confining barrier layer: $Zn_xCd_{1-x}Se$, ZnSe or ZnS or $Mg_{1-x}Zn_xS_{1-y}Se_y$ or $Zn_xCd_{1-x}S_{1-y}Se_y$ (Wurtzite Phase)

Combination 6
Material class: Wurtzite Phase
Examples: GaP, AlP, $Al_xGa_{1-x}P$, and $GaAs_yP_{1-y}$
Substrate: GaSe or other layered material
Color: blue, green, or red by modifying the ratio of Al, Ga, As, and P in the well layer and/or barrier layer Combination 7
Material class: Wurtzite Phase
Examples: $(Al_xGa_{1-x})_{0.51}In_{0.49}P$, $Ga_{0.5}In_{0.5}P$, $Al_xIn_{1-x}P$
Substrate: GaSe or other layered material
Color: blue, green, or red by modifying the ratio of Al, Ga, In, and P in the well layer and/or barrier layer Combination 8
Material class: Zinc Blende Phase
Examples: $(Al_xGa_{1-x})_{0.5}In_{0.49}P$, $Ga_{0.5}In_{0.5}P$, $Al_xIn_{1-x}P$
Substrate: GaAs (100), InP (100), or a metamorphic layer on GaAs (100)
Color: green-yellow or red by modifying the ratio of Al, Ga, In, and P in the well layer and/or barrier layer Combination 9
Material class: III-V Nitride (Cubic Phase)
Quantum confining well layer: $In_xGa_{1-x}N$
Quantum confining barrier layer: GaN, or AlN, or $In_xGa_{1-x}N$
Substrate: Cubic SiC on Silicon 111 substrate, or Cubic SiC substrate
Color: blue, green, yellow, or red by increasing the ratio of In in the well and/or increasing the barrier layer thickness Combination 10
Material class: III-V Nitrides (Wurtzite Phase)
Quantum confining well layer: $In_xGa_{1-x}N$
Quantum confining barrier layer: GaN, or AlN, or $In_xGa_{1-x}N$
Substrate: sapphire
Color: blue, green, or yellow by increasing the ratio of In in the well and/or increasing the barrier layer thickness Combination 11
Material class: III-V (Zinc Blende Phase)
Quantum confining well layer: InGaAlP
Quantum confining barrier layer: InGaP
Substrate: GaAs (100)
Color: red Using Localized Surface Plasmons to Increase Efficiency of the Substrate and/or Input-Side Coating Plasmonic photonic is the field of using plasmonic nanostructures to generate, manipulate, detect, transfer and store light information in nanometer-scale region via surface plasmons. Plasmons are the collective quantum excitation of free electrons in solids, or the collective oscillation of a metal's conduction electrons, and they come in a variety of forms. Surface plasmon refers to the electron plasma oscillations near a metal surface (metal dielectric interface). A polariton defined as a "quasiparticle" resulting from the coupling of electromagnetic waves with an electric and or magnetic dipole carrying excitation. A surface Plasmon polariton which consists of a combined excitation of a surface Plasmon and a photon, or light waves trapped on the surface of a conductor. Localized surface plasmons (LSPs) refers to surface plasmon excitations in bounded geometries (as opposed to infinitely long metal films) such as particles (micro and nano domains, variety of shapes etc.).

Figure 28:
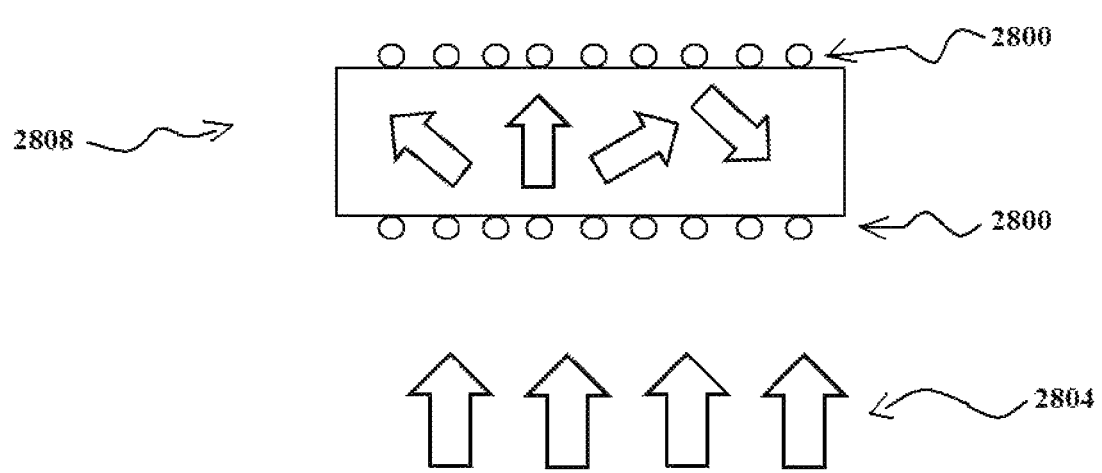
FIG. 28 is a diagram illustrating the use of localized surface plasmons to assist in increasing the efficiency of input pump light reaching a CC layer through a substrate and/or input-side coating.

The treatment of texturing was described above for increasing the amount of input pump light within the substrate and/or input-side coating reaching a CC layer of a light-emitting structure or color-conversion structure of the present disclosure. As illustrated at a high level in FIG. 28, LSPs 2800 can also be used to increase the amount of input pump light 2804 entering a CC layer (not shown, but would be located above substrate and/or input-side coating (collectively, element 2808) in FIG. 28) and thereby increasing the color-conversion efficiency. LSPs 2800 create a scattering mechanism/pathway whereby input pump light 2804 coming into the substrate and/or coating 2808 at very high angles, instead of suffering from TIR is converted into LSPs and enters and scatters inside the substrate and/or coating. This allows for larger portion of input pump light 2804 to be absorbed by the CC layer resulting in increased system efficiency. LSP treatment may be applied to any of the substrates and/or input-side coatings disclosed herein including those illustrated in the appended drawings and those described or otherwise noted in this disclosure.

The conductive coating material used to make the plasmonic surfaces may include metals such as aluminum, copper, steel, carbon steel, magnesium, stainless steel, titanium, super alloys, lead, nickel, brass, gold, silver, platinum, rhodium, incoloy, inconel, iron, molybdenum, monel, nichrome, chromium, tantalum, tin, tungsten, zinc, solder (Sb/Tn), invar, kovar, etc. Their respective alloys may also be used. In addition, the metals may be untempered or tempered. Also, the conductive material coatings may also include graphite sheets, and conductive carbon nanotube sheets, films, foils and mats. Heavily doped semiconductor materials may also be used as the free carriers in such materials would support plasmons. The coating materials may be deposited by any known deposition techniques as various outlined in sections earlier.

The LSPs can be created by making the conductive plasmonic coating discontinuous. The discontinuous coating may be deterministically patterned, or be composed of random nano and/or micro metal particles. The discontinuities may be comprised of sub-wavelength holes that may be randomly placed (nano/micro metal particle plasmons), or deterministically placed (sheet plasmons). The nano/micro metal particles may be shaped as spheres, hemispheres, cylinders, dipoles, tube, rods, etc. They may be metallic or semiconducting. The nano/micro metal particles may be fabricated using any known technique, such as, but not limited to:

A) Deposition of a metal film on a substrate followed by annealing of the film/substrate. After a metal coating is deposited, it may be subjected to an outside impulse to create "metal" nano clusters. For example, the metal film post deposition may be thermally annealed to create metal nano clusters. The metal film (and/or underlying substrate and coatings) may be heated using a furnace, lamps, lasers, microwaves, RF radiation, electrical current, etc. The metal film may be broken down into "metal" nano clusters by using non-thermal impulses such as shock waves (for example ultrasonic cavitation), ion beam etching, ion beam milling, ion implantation, etc.

B) Deposition of a continuous metal film followed by lithography to create a patterned film. After the metal coating is deposited, it may be patterned and etched using one or more of the following techniques to create "metal" nano clusters. Photolithography: projection, proximity, contact, Non light based X ray and e-beam lithography, nano imprinting lithography, nano stamping, micro imprinting, hot/cold embossing. Laser ablation, femto second laser ablation, laser etching, laser stripping, ion beam milling, ion beam etching, etc., may be used instead of using photolithography.

C) Many other methods can be envisioned for fabricating entrapped metal nano/micro clusters in a host such as ion implantation, sol-gel processing, gas/ion cluster beam deposition, ion exchange and ion irradiation, ion exchange and mask assisted ion irradiation, etc. Heat treatments may be used during or post deposition to consolidate the metal nano/micro clusters, if so desired.

D) The co-deposition of the host material and metal coating materials. As an example: co-sputtering from a semiconductor+metal target, or a metal/metal (multi metal) target, with reactive gas to convert one metal into a sputtered host coating would allow for the creation of entrapped metal nano/micro clusters in a host matrix. Again, heat treatments may be used during or post deposition for further cluster consolidation.

E) Alternatively, sequential sputtering from a host target and a metal target, or a metal target and another metal target with reactive gas to convert one metal into a sputtered host would allow for the creation of entrapped metal nano/micro clusters in a host matrix. Again, heat treatments may be used during or post deposition for further cluster consolidation.

F) Single/Double/Multi ion-beam sputtering to fabricate coating layers consisting of metal nano/micro clusters embedded in a host matrix. Following are techniques for ex-situ forming of metal nano/micro clusters. Nano (<100 nm) and micro (<100 nm-10 micron) metal particles made ex-situ, may be deposited on top of the coating layer using any one of the following techniques. Spin coating, spray coating, meniscus coating, roller, curtain, or extrusion coating, electrodeposited or electrophoretic technique, ink jet printing, powder jet processes, screen printing, dispensing and blading, gravure, flexo printing, drop-on-demand ink jet printing, sol-gel, dip-plating (dipping), super saturated solutions, Langmuir-Blodgett process, molecular self-assembly, or transfer processes such a nano-transfer printing, laser transfer etc. The metal particles may be deposited "dry", or may be deposited "wet" in a carrier fluid which may be subsequently be removed (by heating, drying, evaporation, etc.).

Benefits of using localized surface plasmons include:
increased absorption in the CC layer (and thus increased efficiency) due to optical path length enhancement (both due to multi pass and preferential scattering effects);
reduced thickness of the color converter (reduces the difficulty in manufacturing the color converter, like QWs etc.);
the architecture allows for a large angle of incidence of the incoming pump input light;
the plasmonic layer can be designed to simultaneously work as a anti-reflection coating, and there is no need for separate anti reflection coating; and
the plasmonic layer can be tailored for a wide range of input pump light wavelengths.

Sub-Wavelength Gratings for Increasing Output Efficiency of CC Layers

Figure 29:
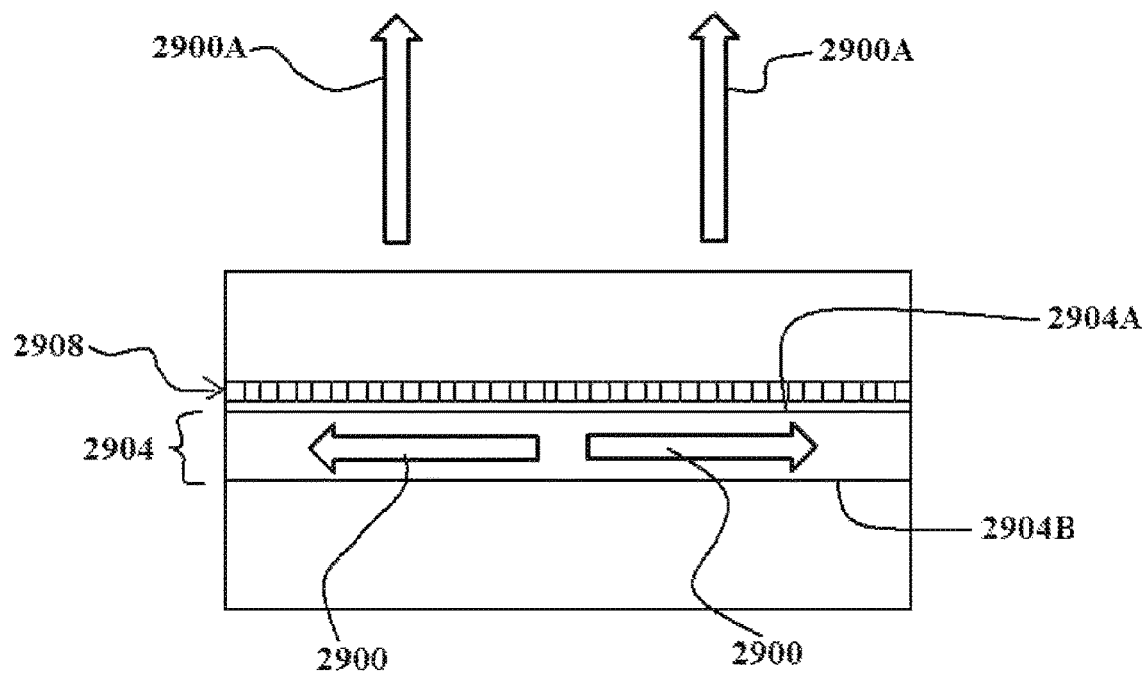
FIG. 29 is a diagram illustrating the use of a sub-wavelength grating to redirect waveguide-mode color-converted light in a CC layer out of the CC layer.

Referring to FIG. 29, as noted above some portion, here portion 2900 of the color-converted light is lost in so-called wave guided modes in the CC layer, here CC layer 2904. To redirect at least some part, here part 2900A, of portion 2900 of the color-converted light out of CC layer 2904 on its output side 2904A, a sub-wavelength grating 2908 is applied to output side 2904A to redirect the color-converted light in these wave guided modes to the surface of the CC layer. As those skilled in the art will understand, a grating with a period smaller than the wavelength is called a "sub-wavelength grating." If light is incident onto a sub-wavelength grating normal to its surface, then only the $0^{th}$ order diffraction exists as a propagation mode; all the higher diffraction orders are evanescent modes. Sub-wavelength grating will basically serve as a simple mirror.

Sub-wavelength grating 2908 will be external, but proximate, to CC layer 2904 and can be monolithic with, or spaced apart from, the CC layer. Sub-wavelength grating 2908 can be on top of CC layer 2904, facing output side 2904A as shown. Sub-wavelength grating 2908 can also or alternatively be below CC layer 2904, facing the input side 2904B of the CC layer. It is noted that use of one or more sub-wavelength gratings can be applied to any of Embodiments 1-6.

Example Display Device

Figure 30:
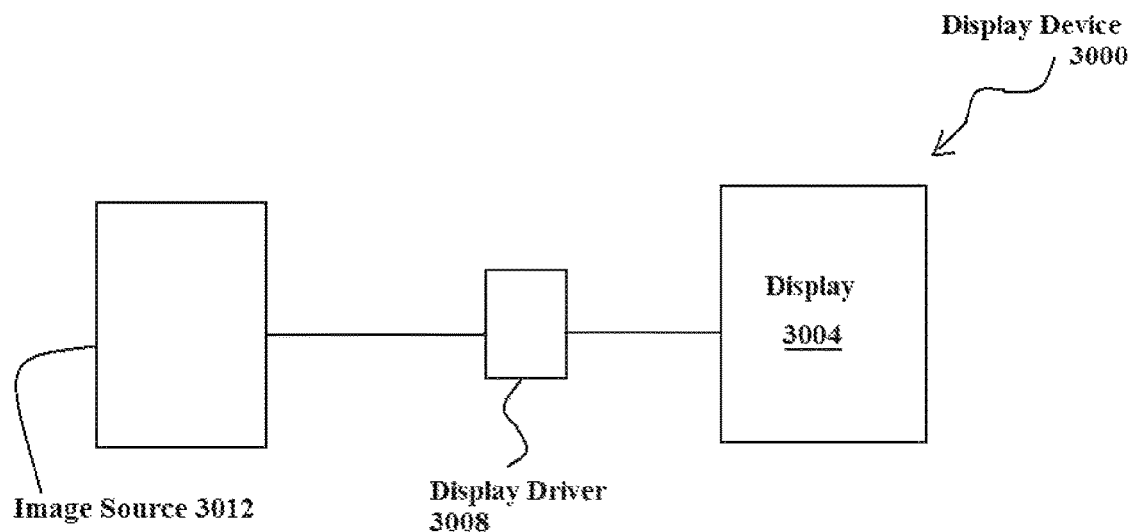
FIG. 30 is a high-level block diagram illustrating an example display device made in accordance with aspects of the present invention.

FIG. 30 illustrates an example display device 3000 made in accordance with aspects of the present invention. In this example, display device 3000 includes a display 3004 and a display driver 3008 that may be designed and configured to drive the display so that the display displays images provided by any suitable image source 3012, such as a computer system, among other things. As those skilled in the art will readily appreciate, display device 3000 may incorporated into any suitable system (not shown), such as a projector (as the projection element), pico-projector (as the projection element), VR system (as the NED), AR system (as the NED), a head-mounted display system (as the visual display element), and a heads-up display system (as the visual display element), among others. It is also noted that display device 3000 need not be for displaying images. Rather, it may be a solid-state lighting device for any of a variety of applications including, but not limited to, automotive headlights, general purpose lighting for rooms or other spaces, and ambiance lighting for room and other spaces, among others. It is noted that for lighting (i.e., non-image) applications, display driver 3008 may be configured to drive display 3004 so that it has selectable output intensity, selectable output color, selectable output saturation, and/or drives the display so that it outputs differing colors in differing regions in a fixed or varying manner, among other things. Those skilled in the art will readily understand how display driver 3008 can be configured to produce any suitable type of lighting effect(s). Technologies for configuring display driver 3008 are well known in the art and, therefore, need not be described herein for those skilled in the art to make and use a display driver suitable for use as display driver 3008.

Display 3004 is composed of many fine-pitched pixels (not illustrated) that are formed in a light-emitting structure (not specifically illustrated) made in accordance with the present disclosure, such as any of the light-emitting structures illustrated in the appended drawings and/or described herein, or apparent to someone skilled in the art after reading and understanding this entire disclosure, including any one or more of the various modifications and/or additional features disclosed herein. Those skilled in the art will readily understand how to create an entire display using the fundamental features and teachings of the present disclosure without undue experimentation by implementing these features and teaching by building on knowledge of conventional display technology and known behaviors of relevant materials.

The foregoing has been a detailed description of illustrative embodiments and examples of the invention. It is noted that in the present specification and claims appended hereto, conjunctive language such as is used in the phrases "at least one of X, Y and Z" and "one or more of X, Y, and Z," unless specifically stated or indicated otherwise, shall be taken to mean that each item in the conjunctive list can be present in any number exclusive of every other item in the list or in any number in combination with any or all other item(s) in the conjunctive list, each of which may also be present in any number. Applying this general rule, the conjunctive phrases in the foregoing examples in which the conjunctive list consists of X, Y, and Z shall each encompass: one or more of X; one or more of Y; one or more of Z; one or more of X and one or more of Y; one or more of Y and one or more of Z; one or more of X and one or more of Z; and one or more of X, one or more of Y and one or more of Z.

Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve aspects of the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A color-converting structure for use with a micro-light-emitting-diode (LED) array comprising individually addressable pixel elements each having a size of 30 microns or less and each emitting pump light of a first color composition, the color-converting structure comprising:
a color converting layer having a input side and a output side spaced from the input side, wherein:
the input side is designed and configured to face a light emitting region of the micro-LED array and extend over a plurality of the individually addressable pixel elements;
the color converting layer comprises:
one or more first direct bandgap semiconductor quantum wells, wherein the one or more first direct bandgap semiconductor quantum wells are designed and configured so that, when the color-converting structure is deployed for use with the micro-LED array, the color-converting layer receives the pump light through the input side and the one or more first direct bandgap semiconductor quantum wells convert at least a portion of the pump light from the first color composition to a second color composition different from the first color composition so that the color converting layer outputs color-converted light of the second color composition through the output side; and
the color converting layer further comprises one or more second direct bandgap semiconductor quantum wells formed on the substrate, wherein the one or more second direct bandgap semiconductor quantum wells are designed and configured so that when the color-converting structure is deployed for use with the micro-LED array, the color-converting layer receives the pump light through the input side and the one or more second direct bandgap semiconductor quantum wells convert at least a portion of the pump light from the first color composition to a third color composition different from each of the first and second color compositions so that the color converting layer further outputs color-converted light of the third color composition through the output side.

2. The color-converting structure according to claim 1, wherein the one or more first direct bandgap semiconductor quantum wells are not present within the color converting layer where the one or more second direct bandgap semiconductor quantum wells are present and the one or more second direct bandgap semiconductor quantum wells are not present within the color converting layer where the one or more first direct bandgap semiconductor quantum wells are present.

3. The color converting structure according to claim 2, wherein the color converting layer includes regions where neither the one or more first direct bandgap semiconductor quantum wells nor the one or more second direct bandgap semiconductor quantum wells are present so that a portion of the pump light can pass through the color converting structure without color conversion.

4. The color converting structure according to claim 3, wherein the first color composition is blue, the second color composition is green, and the third color composition is red.

5. The color converting structure according to claim 1, wherein:
the one or more second direct bandgap semiconductor quantum wells have a higher bandgap than the one or more first direct bandgap semiconductor quantum wells;
the one or more second direct bandgap semiconductor quantum wells are located closer to the output side of the color converting layer than the one or more first direct bandgap semiconductor quantum wells; and
the one or more second direct bandgap semiconductor quantum wells are present where than the one or more first direct bandgap semiconductor quantum wells are present.

6. The color converting structure according to claim 5, wherein the second color composition is green and the third color composition is red.

7. A color-converting structure for use with a micro-light-emitting-diode (LED) array comprising individually addressable pixel elements each having a size of 30 microns or less and each emitting pump light of a first color composition, the color-converting structure comprising:
- a color converting layer having a input side and a output side spaced from the input side, wherein:
  - the input side is designed and configured to face a light emitting region of the micro-LED array and extend over a plurality of the individually addressable pixel elements;
  - the color converting layer comprises:
    - one or more first direct bandgap semiconductor quantum wells, wherein the one or more first direct bandgap semiconductor quantum wells are designed and configured so that, when the color-converting structure is deployed for use with the micro-LED array, the color-converting layer receives the pump light through the input side and the one or more first direct bandgap semiconductor quantum wells convert at least a portion of the pump light from the first color composition to a second color composition different from the first color composition so that the color converting layer outputs color-converted light of the second color composition through the output side; and
  - the color converting layer further comprises a quantum well structure formed separately from the one or more first direct bandgap semiconductor quantum wells and secured to the one or more first direct bandgap semiconductor quantum wells via a bonding agent, wherein the quantum well structure comprises one or more second direct bandgap semiconductor quantum wells are designed and configured so that when the color-converting structure is deployed for use with the micro-LED array, the color-converting layer receives the pump light through the input side and the one or more second direct bandgap semiconductor quantum wells convert at least a portion of the pump light from the first color composition to a third color composition different from each of the first and second color compositions so that the color converting layer further outputs color-converted light of the third color composition through the output side.

8. The color-converting structure according to claim 7, wherein the one or more first direct bandgap semiconductor quantum wells are not present within the color converting layer where the one or more second direct bandgap semiconductor quantum wells are present and the one or more second direct bandgap semiconductor quantum wells are not present within the color converting layer where the one or more first direct bandgap semiconductor quantum wells are present.

9. The color converting structure according to claim 8, wherein the color converting layer includes regions where neither the one or more first direct bandgap semiconductor quantum wells nor the one or more second direct bandgap semiconductor quantum wells are present so that a portion of the pump light can pass through the color converting structure without color conversion.

10. The color converting structure according to claim 9, wherein the first color composition is blue, the second color composition is green, and the third color composition is red.

11. The color converting structure according to claim 7, wherein:
- the one or more second direct bandgap semiconductor quantum wells have a higher bandgap than the one or more first direct bandgap semiconductor quantum wells;
- the one or more second direct bandgap semiconductor quantum wells are located closer to the output side of the color converting layer than the one or more first direct bandgap semiconductor quantum wells; and
- the one or more second direct bandgap semiconductor quantum wells are present where than the one or more first direct bandgap semiconductor quantum wells are present.

12. The color converting structure according to claim 11, wherein the second color composition is green and the third color composition is red.

* * * * *